(12) United States Patent
Ishitobi et al.

(10) Patent No.: US 7,232,781 B2
(45) Date of Patent: Jun. 19, 2007

(54) DIELECTRIC CERAMIC COMPOSITION, DIELECTRIC CERAMIC, AND LAMINATED CERAMIC PART INCLUDING THE SAME

(75) Inventors: Shinichi Ishitobi, Ube (JP); Koichi Fukuda, Ube (JP); Takafumi Kawano, Ube (JP); Hisayoshi Iba, Ube (JP)

(73) Assignee: UBE Industries, Ltd., Yamaguchi (JP)

( * ) Notice: Subject to any disclaimer, the term of this patent is extended or adjusted under 35 U.S.C. 154(b) by 111 days.

(21) Appl. No.: 10/543,234

(22) PCT Filed: Jan. 20, 2004

(86) PCT No.: PCT/JP2004/000423
§ 371 (c)(1),
(2), (4) Date: Jul. 22, 2005

(87) PCT Pub. No.: WO2004/065325

PCT Pub. Date: Aug. 5, 2004

(65) Prior Publication Data
US 2006/0142141 A1 Jun. 29, 2006

(30) Foreign Application Priority Data

| Jan. 24, 2003 | (JP) | ............................. 2003-016004 |
| Mar. 13, 2003 | (JP) | ............................. 2003-067719 |
| Apr. 3, 2003 | (JP) | ............................. 2003-100676 |
| Jun. 2, 2003 | (JP) | ............................. 2003-156949 |

(51) Int. Cl.
C04B 35/465 (2006.01)
B32B 18/00 (2006.01)
B32B 17/06 (2006.01)

(52) U.S. Cl. ...................... 501/136; 501/122; 428/210; 428/701; 428/702

(58) Field of Classification Search .................. 501/136, 501/122; 428/210, 701, 702
See application file for complete search history.

(56) References Cited

U.S. PATENT DOCUMENTS 5,916,834 A * 6/1999 Terashi et al. .............. 501/135
2006/0142141 A1* 6/2006 Ishitobi et al. .............. 501/136

FOREIGN PATENT DOCUMENTS

| JP | 6-199568 | 7/1994 |
| JP | 6-236708 | 8/1994 |
| JP | 2001-240470 | 9/2001 |
| JP | 2002-053368 | 2/2002 |
| JP | 2002-338341 | 11/2002 |
| JP | 2003-112971 | 4/2003 |

* cited by examiner

*Primary Examiner*—Karl Group
(74) *Attorney, Agent, or Firm*—Frommer Lawrence & Haug LLP; Ronald R. Santucci

(57) ABSTRACT

A dielectric ceramic composition which can be sintered at such a temperature of about 800 to 1000° C. as to permit incorporation of and multilayer formation with a low resistant conductor such as Ag or Cu by the simultaneous sintering with the low resistant conductor, which is sintered to form dielectric ceramics having a dielectric constant $\epsilon_r$ of not more than 10, and a resonator having a large $Q \times f_0$ value and an absolute value in temperature coefficient $\tau_f$ of resonance frequency $f_0$ of not more than 20 ppm/° C., the value being easy to be controlled. The dielectric ceramic composition contains a glass component in an amount of 5 to 150 parts by weight based on 100 parts by weight of a main component represented by general formula: $aZnAl_2O_4$-$bZn_2SiO_4$-$cTiO_2$-$dZn_2TiO_4$, in which the molar fractions of respective components a, b, c, and d satisfy $5.0 \leq a \leq 80.0$ mol % $5.0 \leq b \leq 70.0$ mol %, $5.0 \leq c \leq 27.5$ mol %, $0 \leq d \leq 30.0$ mol % (a+b+c+d=100 mol %) The main component may also be represented by $aMg_2SiO_4$-$bZn_2Al_2O_4$-$cSiO_2$-$dCaTiO_3$-$eZn_2SiO_4$.

7 Claims, 7 Drawing Sheets

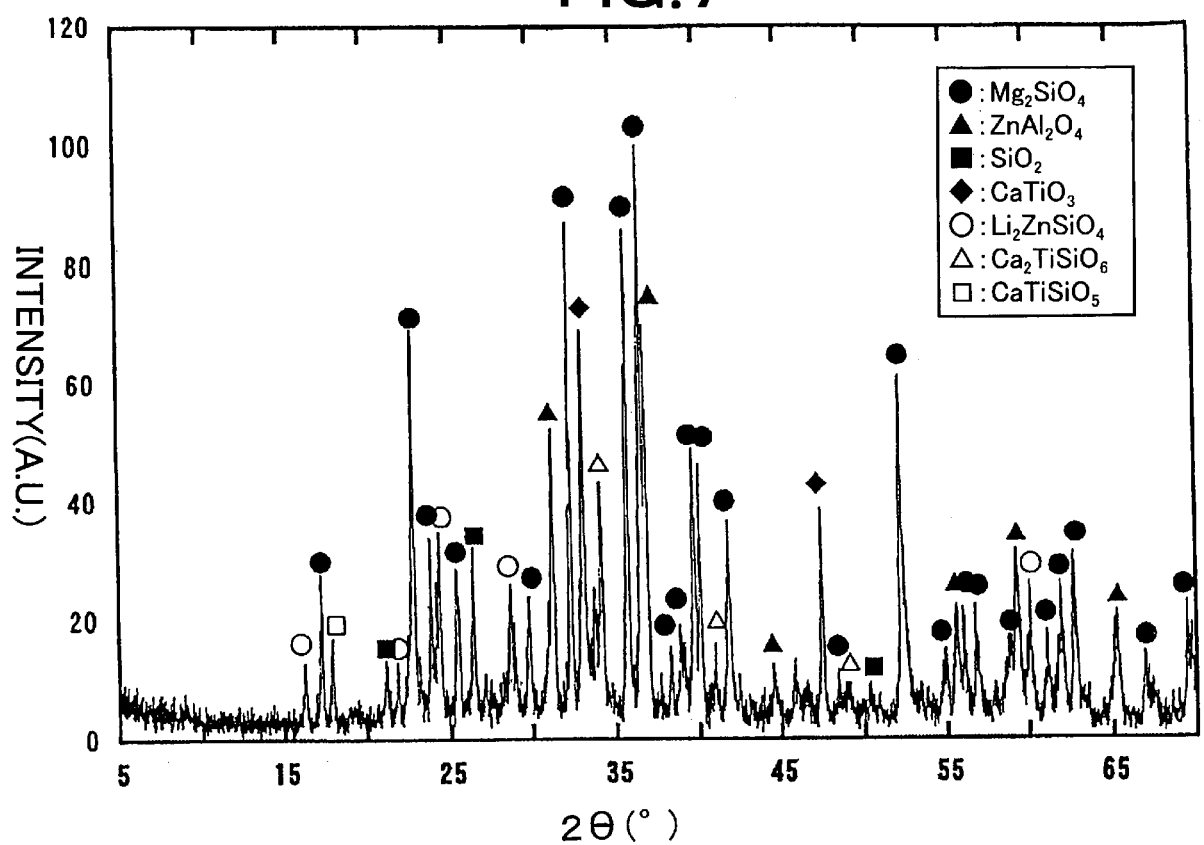

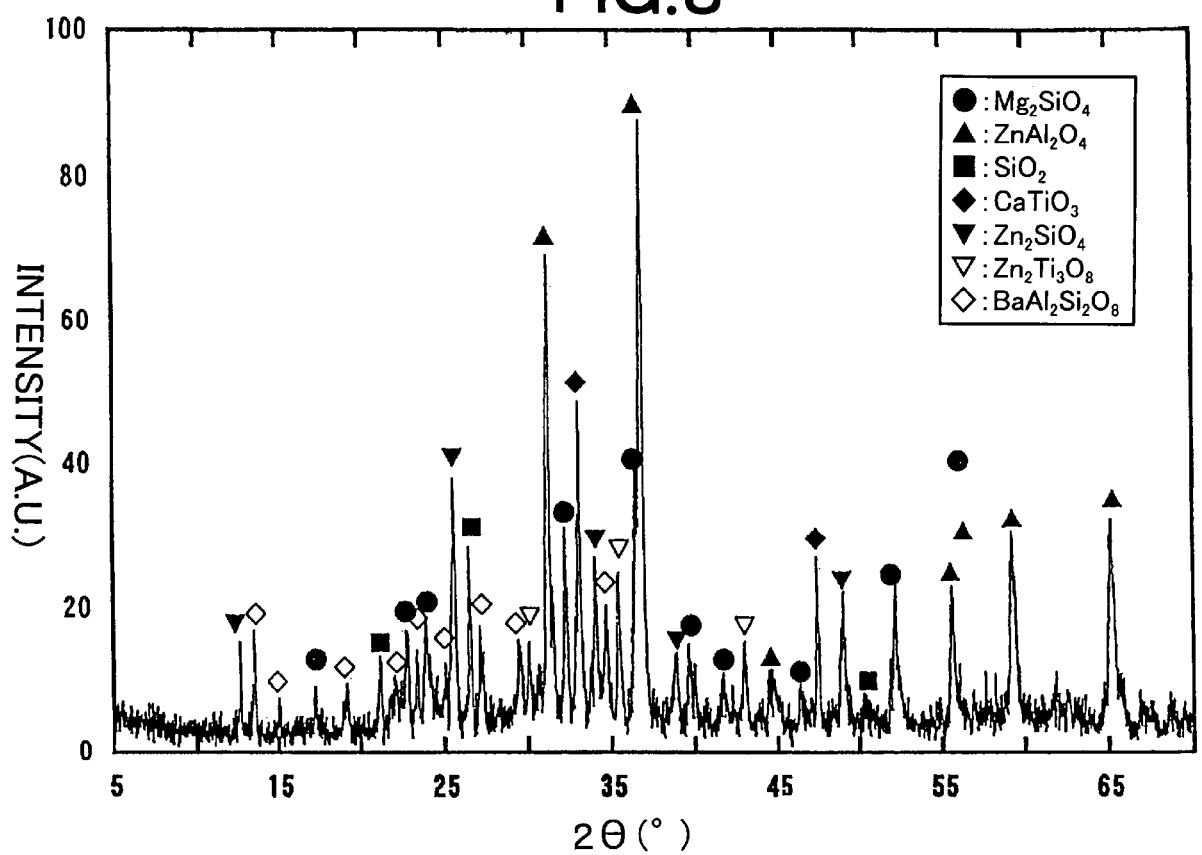

DIELECTRIC CERAMIC COMPOSITION, DIELECTRIC CERAMIC, AND LAMINATED CERAMIC PART INCLUDING THE SAME This application is a 371 of PCT/JP2004/000423 filed on Jan. 20, 2004, published on Aug. 5, 2004 under publication number WO 2004/065325 A1 which claims priority benefits from Japanese Patent Application Number 2003-016004 filed Jan. 24, 2003 and Japanese Patent Application Number 2003-067719 filed Mar. 13, 2003 and Japanese Patent Application Number 2003-100676 filed Apr. 3, 2003 and Japanese Patent Application Number 2003-156949 filed Jun. 2, 2003.

TECHNICAL FIELD

The present invention relates to a dielectric ceramic composition that has a dielectric constant $\epsilon_r$ of not more than 10, a large Q-value in high-frequency region such as microwave or millimeter wave, and a small absolute value in temperature coefficient $\tau_f$ of resonance frequency $f_0$ and that can be sintered simultaneously with Ag, Cu or the like as a low resistant conductor, dielectric ceramics obtained by sintering the dielectric ceramic composition, and a laminated ceramic part using the dielectric ceramics, such as a laminated dielectric resonator, a laminated dielectric filter, and a laminated dielectric substrate.

BACKGROUND ART

In recent years, along with a rapid development of communication networks, frequency range to be used for the communication is extended to cover high-frequency region such as microwave region or millimeter wave region. With regards to the dielectric ceramic composition for high frequency, it is demanded that a dielectric resonator using dielectric ceramics obtained by sintering the dielectric ceramic composition has a large unloaded Q-value. Further, the dielectric ceramic composition for high frequency is demanded to have a small absolute value in temperature coefficient $\tau_f$ of resonance frequency $f_0$. On the other hand, as the dielectric constant $\epsilon_r$ of the dielectric ceramics is larger, a microwave circuit or millimeter wave circuit can be more reduced in the size. However, in terms of high-frequency region corresponding to microwave region, when the dielectric constant $\epsilon_r$ becomes too large, the circuit is excessively reduced in the size, with the result that high processing precision is demanded. Therefore, a material having a small dielectric constant $\epsilon_r$ is required.

As the dielectric ceramic composition for manufacturing a dielectric resonator having a large Q-value and a small absolute value in temperature coefficient $\tau_f$ of the resonance frequency $f_0$, BaO—MgO—WO$_3$-base material (refer to JP(A)-6-236708 (paragraph number [0033] on page 11, tables 1 to 8)), MgTiO$_3$—CaTiO$_3$-base material (refer to JP(A)-6-199568 (paragraph number [0018] on page 5, tables 1 to 3)), and the like have been proposed. However, the dielectric constant $\epsilon_r$ of the dielectric ceramics obtained from the above ceramic compositions exceeds 10. Hence, the dielectric ceramic composition from which dielectric ceramics having a lower dielectric constant can be manufactured is demanded.

Forsterite (Mg$_2$SiO$_4$) and Alumina (Al$_2$O$_3$), which have relatively small dielectric constants $\epsilon_r$ of 7 and 10 respectively, are known as the dielectric ceramic composition from which a dielectric ceramics excellent in high-frequency characteristics can be manufactured. However, the temperature dependency ($\tau_f$) of resonance frequency is large on the minus side (−60 ppm/° C.), so that an application to such uses as the dielectric resonator and dielectric filter where the temperature dependency needs to be small is limited.

In recent years, laminated ceramic parts formed by laminating dielectric ceramics, such as a laminated dielectric resonator, a laminated dielectric filter, or a laminated dielectric substrate have been developed and the lamination by the simultaneous sintering of a dielectric ceramic composition and an internal electrode is being performed. However, the above-described dielectric ceramic compositions have a difficulty in performing the simultaneous sintering with the internal electrode because of their high sintering temperature of 1300° C. or more and therefore, for forming a lamination structure, material of the internal electrode is limited to an expensive high-temperature resistant material such as platinum (Pt). For this reason, there has been demanded a dielectric ceramic composition capable of performing the simultaneous sintering with the internal electrode at a low temperature of 1000° C. or less, using as the internal electrode material silver (Ag), Ag—Pd, Cu and the like, which are low resistant and inexpensive conductors.

As the dielectric ceramics having a small dielectric constant and capable of performing the sintering at a low temperature, ceramics comprising a ZnAl$_2$O$_4$ crystal, an α-SiO$_2$ crystal, a Zn$_2$SiO$_4$ crystal, and a glass phase is known (refer to JP(A)-2002-338341 (paragraph number [0050] on page 10, table 4, etc.)). This material is a printed circuit board material including the glass phase and, therefore, a mechanical strength is stressed in it. However, the Q-value of the resonator is not sufficient for a high-frequency dielectric ceramics. Further, there is no description about the temperature coefficient $\tau_f$ of resonance frequency $f_0$ in the above publication.

In addition, as the dielectric ceramics having a small dielectric constant and capable of performing the sintering at a low temperature, a ceramics comprising SiO$_2$, Al$_2$O$_3$, MgO, ZnO, and B$_2$O$_3$, where crystalline phases of ZnO and Al$_2$O$_3$, crystalline phases of ZnO and SiO$_2$, crystalline phases of MgO and SiO$_2$, and amorphous phase of SiO$_2$ or amorphous phases of SiO$_2$ and B$_2$O$_3$ are present together is known (refer to JP(A)-2002-53368 (paragraph number [0053] on page 5, table 2, etc.)). This material is a printed circuit board material including the glass phase and, therefore, a mechanical strength is stressed in it. However, the Q-value of the resonator is not sufficient for high-frequency dielectric ceramics. Further, there is no description about the temperature coefficient $\tau_f$ of resonance frequency $f_0$ in the above publication.

DISCLOSURE OF THE INVENTION

An object of the present invention is to provide a dielectric ceramic composition which is capable of solving the above problem, which can be sintered at such a temperature of about 800 to 1000° C. as to permit incorporation of and multilayer formation with a low resistant conductor such as Ag or Cu by the simultaneous sintering with the low resistant conductor, which is sintered to form dielectric ceramics having a dielectric constant $\epsilon_r$ of not more than 10, and a resonator having a large Q×f$_0$ value and an absolute value in temperature coefficient $\tau_f$ of resonance frequency f$_0$ of not more than 20 ppm/° C., the value being easy to be controlled. Another object of the present invention is to provide a laminated ceramic part such as a laminated dielectric resonator, a laminated filter, or a laminated dielectric substrate, which has dielectric layers obtained by sintering the above dielectric ceramic composition and an internal electrode mainly comprising Ag or Cu.

To achieve the above object, according to a first aspect of the present invention, there is provided a dielectric ceramic composition containing a glass component in an amount of 5 to 150 parts by weight based on 100 parts by weight of a main component represented by general formula (1): $aZnAl_2O_4$-$bZn_2SiO_4$-$cTiO_2$-$dZn_2TiO_4$, in which the molar fractions of respective components a, b, c, and d satisfy $5.0 \leq a \leq 80.0$ mol %, $5.0 \leq b \leq 70.0$ mol %, $5.0 \leq c \leq 27.5$ mol %, $0 \leq d \leq 30.0$ mol % (a+b+c+d=100 mol %).

In the first aspect of the present invention, the glass component may include one or more glasses selected from a PbO-base glass, a ZnO-base glass, a $SiO_2$-base glass, a $B_2O_3$-base glass, and a glass comprising two or more oxides selected from the group consisting of $SiO_2$, $Al_2O_3$, ZnO, PbO, $Bi_2O_3$, BaO, SrO, CaO, $SnO_2$, $ZrO_2$, and $B_2O_3$.

By sintering the above dielectric ceramic composition, dielectric ceramics containing crystalline phases of $ZnAl_2O_4$, $Zn_2SiO_4$, and $Zn_2TiO_4$ and a glass phase, or containing crystalline phases of $ZnAl_2O_4$, $Zn_2SiO_4$, $TiO_2$ and $Zn_2TiO_4$ and a glass phase are obtained.

To achieve the above object, according to a second aspect of the present invention, there is provided a dielectric ceramic composition containing a Li compound as a subcomponent in an amount of 2 to 30 parts by weight in terms of $Li_2O$ and a glass component in an amount of 5 to 150 parts by weight, based on 100 parts by weight of a main component comprising a calcined body obtained by calcining a material composition represented by general formula (2): $aZnO$-$bAl_2O_3$-$cSiO_2$-$d(xCaO$-$(1-x)TiO_2)$, in which the molar fractions of respective components a, b, c, and d satisfy $7.5 \leq a \leq 55.0$ mol %, $5.0 \leq b \leq 65.0$ mol %, $5.0 \leq c \leq 70.0$ mol %, $7.5 \leq d \leq 27.5$ mol % (a+b+c+d=100 mol %) and x satisfies $0 \leq x \leq 0.75$.

In the second aspect of the present invention, the main component may contain a $ZnAl_2O_4$ crystal, a $Zn_2SiO_4$ crystal, and at least one of a $CaTiO_3$ crystal and a $TiO_2$ crystal. In the second aspect of the present invention, the glass component may include one or more glasses selected from a PbO-base glass, a ZnO-base glass, a $SiO_2$-base glass, a $B_2O_3$-base glass, and a glass comprising two or more oxides selected from the group consisting of $SiO_2$, $Al_2O_3$, ZnO, PbO, $Bi_2O_3$, BaO, SrO, $SnO_2$, $ZrO_2$, and $B_2O_3$. Further, in the second aspect of the present invention, the glass component may be composed of $SiO_2$ in an amount of 2.5 to 70 wt %, $Al_2O_3$ in an amount of 0 to 15 wt %, ZnO in an amount of 10 to 55 wt %, PbO in an amount of 0 to 35 wt %, $Bi_2O_3$ in an amount of 0 to 2 wt %, BaO in an amount of 0 to 5 wt %, SrO in an amount of 0 to 2 wt %, $SnO_2$ in an amount of 0 to 2 wt %, $ZrO_2$ in an amount of 0 to 1 wt %, and $B_2O_3$ in an amount of 10 to 50 wt %.

By sintering the above dielectric ceramic composition, dielectric ceramics containing one or more crystalline phases of $ZnAl_2O_4$, $Zn_2SiO_4$, and at least one of $CaTiO_3$ and $TiO_2$ and a glass phase are obtained.

The above dielectric ceramic composition can be produced by mixing a Li compound as a subcomponent in an amount of 2 to 30 parts by weight in terms of $Li_2O$ and a glass component in an amount of 5 to 150 parts by weight, based on 100 parts by weight of a main component comprising a calcined body obtained by calcining, at from 900 to 1200° C., a material composition represented by general formula (2), in which the molar fractions of respective components a, b, c, and d and coefficient x fall within the above ranges.

To achieve the above object, according to a third aspect of the present invention, there is provided a dielectric ceramic composition containing a Li compound as a subcomponent in an amount of 2 to 30 parts by weight in terms of $Li_2O$ and a glass component in an amount of 5 to 150 parts by weight, based on 100 parts by weight of a main component represented by general formula (3): $aZnAl_2O_4$-$bZn_2SiO_4$-$cSiO_2$-$dSrTiO_3$, in which the molar fractions of respective components a, b, c, and d satisfy $2.5 \leq a \leq 77.5$ mol %, $2.5 \leq b \leq 77.5$ mol %, $2.5 \leq c \leq 37.5$ mol %, $10.0 \leq d \leq 17.5$ mol % (a+b+c+d=100 mol %).

In the third aspect of the present invention, the glass component may include one or more glasses selected from a PbO-base glass, a ZnO-base glass, a $SiO_2$-base glass, a $B_2O_3$-base glass, and a glass comprising two or more oxides selected from the group consisting of $SiO_2$, $Al_2O_3$, ZnO, PbO, $Bi_2O_3$, BaO, SrO, $SnO_2$, $ZrO_2$, and $B_2O_3$. Further, in the third aspect of the present invention, the glass component may be composed of $SiO_2$ in an amount of 2.5 to 70 wt %, $Al_2O_3$ in an amount of 0 to 15 wt %, ZnO in an amount of 10 to 55 wt %, PbO in an amount of 0 to 35 wt %, $Bi_2O_3$ in an amount of 0 to 2 wt %, BaO in an amount of 0 to 5 wt %, SrO in an amount of 0 to 2 wt %, $SnO_2$ in an amount of 0 to 2 wt %, $ZrO_2$ in an amount of 0 to 1 wt %, and $B_2O_3$ in an amount of 10 to 50 wt %.

By sintering the above dielectric ceramic composition, dielectric ceramics containing crystalline phases of $ZnAl_2O_4$, $Zn_2SiO_4$, and $SrTiO_3$ and a glass phase are obtained.

To achieve the above object, according to a fourth aspect of the present invention, there is provided a dielectric ceramic composition containing a Li compound as a subcomponent in an amount of 1 to 15 parts by weight in terms of $Li_2O$ and a glass component in an amount of 5 to 150 parts by weight, based on 100 parts by weight of a main component represented by general formula (4): $aMg_2SiO_4$-$bZnAl_2O_4$-$cSiO_2$-$dCaTiO_3$-$eZn_2SiO_4$, in which the molar fractions of respective components a, b, c, d, and e satisfy $0.10 \leq a \leq 0.72$, $0.08 \leq b \leq 0.62$, $0.02 \leq c \leq 0.22$, $0.12 \leq d \leq 0.22$, $0 \leq e \leq 0.08$ (a+b+c+d+e=1).

In the fourth aspect of the present invention, the glass component may include one or more glasses selected from a PbO-base glass, a ZnO-base glass, a $SiO_2$-base glass, a $B_2O_3$-base glass, and a glass comprising two or more oxides selected from the group consisting of $SiO_2$, $Al_2O_3$, ZnO, PbO, $Bi_2O_3$, BaO, SrO, $SnO_2$, $ZrO_2$, and $B_2O_3$. Further, in the fourth aspect of the present invention, the glass component may be composed of $SiO_2$ in an amount of 2 to 70 wt %, $Al_2O_3$ in an amount of 0 to 15 wt %, ZnO in an amount of 10 to 55 wt %, PbO in an amount of 0 to 35 wt %, $Bi_2O_3$ in an amount of 0 to 2 wt %, BaO in an amount of 0 to 30 wt %, SrO in an amount of 0 to 2 wt %, $SnO_2$ in an amount of 0 to 2 wt %, $ZrO_2$ in an amount of 0 to 1 wt %, and $B_2O_3$ in an amount of 10 to 50 wt %.

By sintering the above dielectric ceramic composition, dielectric ceramics containing crystalline phases of $Mg_2SiO_4$, $ZnAl_2O_4$, $SiO_2$, and $CaTiO_3$, and a glass phase, or containing crystalline phases of $Mg_2SiO_4$, $ZnAl_2O_4$, $SiO_2$, $CaTiO_3$, and $Zn_2SiO_4$, and a glass phase are obtained.

Further, according to the present invention, there is provided a dielectric ceramic part having a plurality of dielectric layers, an internal electrode formed between the dielectric layers and an external electrode electrically connected to the internal electrode, characterized in that the dielectric layers are constituted of dielectric ceramics obtained by sintering: the dielectric ceramic composition comprising a main component represented by the general formula (1); the dielectric ceramic composition comprising a calcined body of a material composition represented by the general formula (2) as a main component; the dielectric ceramic composition comprising a main component represented by the general formula (3); or the dielectric ceramic composition comprising a main component represented by the general formula (4), and the internal electrode is made of elemental Cu or elemental Ag, or an alloy material mainly comprising Cu or Ag.

Since the dielectric ceramic composition according to the present invention can be sintered at a sintering temperature of 1000° C. or less, it is possible to perform simultaneous sintering with a low resistant conductor such as Cu or Ag. Further, by sintering the dielectric ceramic composition according to the present invention, it is possible to provide ceramics exhibiting a large $Q \times f_0$ value, which is a product of resonance frequency $f_0$ (GHz) and Q-value, of 10000 (GHz) or more, or in some cases, 20000 (GHz) or more, and having a low dielectric loss. Further, the dielectric ceramic composition according to the present invention can provide ceramics having an absolute value in temperature coefficient ($\tau_f$) of resonance frequency of not more than 20 ppm/° C., and thereby less influenced by temperature. Further, dielectric constant $\epsilon_r$ of dielectric ceramics obtained from the dielectric ceramic composition according to the present invention is not more than 10, so that a high-frequency device or high-frequency circuit obtained using the dielectric ceramics is not excessively reduced in the size, but can be kept in an appropriate size, resulting in excellent processing accuracy and productivity.

BRIEF DESCRIPTION OF THE DRAWINGS

FIG. 7 is an X-ray diffraction pattern of dielectric ceramics obtained in example 68; and FIG. 8 is an X-ray diffraction pattern of dielectric ceramics obtained in example 76.

BEST MODE FOR CARRYING OUT THE INVENTION

Figure 1:
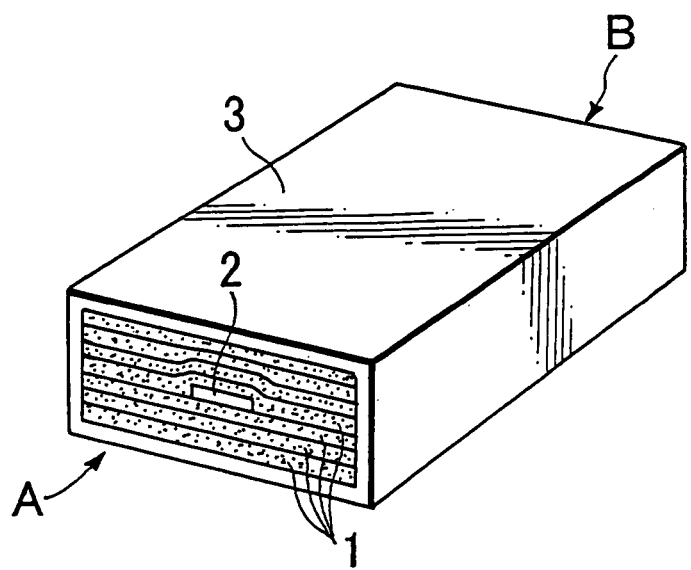
FIG. 1 is a perspective view showing an embodiment of a laminated ceramic part according to the present invention.

Hereinafter, embodiments of the present invention will be described.

(1) FIRST EMBODIMENT (Embodiment Related to a Dielectric Ceramic Composition Comprising a Composition Represented by the above General Formula (1) as a Main Component)

A dielectric ceramic composition according to the present embodiment contains a glass component in an amount of 5 to 150 parts by weight based on 100 parts by weight of the main component represented by the general formula (1): $aZnAl_2O_4 \cdot bZn_2SiO_4 \cdot cTiO_2 \cdot dZn_2TiO_4$.

The glass component to be used is in the form of a glass or powdered glass (glass powder). The glass used herein indicates an amorphous solid substance and can be obtained by fusion. The powdered glass or glass powder is obtained by pulverizing a glass. A crystallized glass partially containing a crystallized substance therein is also included in the glass. Hereinafter, the glass that is referred to as merely "glass" includes the powdered glass or crystallized glass. This is the same for all the following embodiments.

The glass component for use in the present embodiment includes a PbO-base glass, a ZnO-base glass, a $SiO_2$-base glass, a $B_2O_3$-base glass, and a glass comprising metal oxides. The PbO-base glass is a glass containing PbO, and examples thereof include a glass containing $PbO-SiO_2$, $PbO-B_2O_3$ or $PbO-P_2O_5$, or a glass containing $R_2O-PbO-SiO_2$, $R_2O-CaO-PbO-SiO_2$, $R_2O-ZnO-PbO-SiO_2$ or $R_2O-Al_2O_3-PbO-SiO_2$ (herein, $R_2O$ is $Na_2O$ or $K_2O$ (this is the same for all the following embodiments)). The ZnO-base glass is a glass containing ZnO, and examples thereof include a glass containing $ZnO-Al_2O_3-BaO-SiO_2$ or $ZnO-Al_2O_3-R_2O-SiO_2$. The $SiO_2$-base glass is a glass containing $SiO_2$, and examples thereof include a glass containing $SiO_2-Al_2O_3-R_2O$ or $SiO_2-Al_2O_3-BaO$. The $B_2O_3$-base glass is a glass containing $B_2O_3$, and examples thereof include a glass containing $B_2O_3-SiO_2-ZnO$, or $B_2O_3-Al_2O_3-R_2O$.

As the glass component for use in the present embodiment, in addition to the PbO-base glass, the ZnO-base glass, the $SiO_2$-base glass, and the $B_2O_3$ glass, a glass comprising various metal oxides can also be used, and examples thereof include a glass comprising two or more oxides selected from the group consisting of $SiO_2$, $Al_2O_3$, ZnO, PbO, $Bi_2O_3$, BaO, SrO, CaO, $SnO_2$, $ZrO_2$, and $B_2O_3$. Either an amorphous glass or a crystalline glass may be used as the glass. When the glass contains PbO, the sintering temperature is liable to lower, however, the unloaded Q-value is liable to decrease and therefore, the content of the PbO component in the glass is preferably 40% by weight or less. A glass containing a ZnO component, an $Al_2O_3$ component, a BaO component, a $SiO_2$ component, and a $B_2O_3$ component is more preferably used as the glass for use in the present embodiment in that a high unloaded Q-value can be obtained.

Reasons for limiting the composition in the present embodiment will next be described. If the glass component is contained in an amount of less than 5 parts by weight based on 100 parts by weight of the main component served as the base material of the ceramics obtained by sintering, a preferable sintered body cannot be obtained at 1000° C. or less; whereas if the glass component is contained in excess of 150 parts by weight, the glass is liable to elute in sintering, with the result that a preferable sintered body cannot be obtained.

It is unfavorable that the molar fraction a in the main component is less than 5.0 mol %, or it exceeds 80.0 mol %. In the former case, the $Q \times f_0$ value becomes less than 10000 (GHz); in the latter case, the composition cannot be sintered at 1000° C. or less. Further, it is unfavorable that the molar fraction b in the main component is less than 5.0 mol %, or it exceeds 70.0 mol %. In the former case, a preferable sintered body cannot be obtained; in the latter case, the absolute value in temperature coefficient ($\tau_f$) of resonance frequency becomes more than 20 ppm/° C. Further, it is unfavorable that the molar fraction c in the main component is less than 5.0 mol %, or it exceeds 27.5 mol %. In this case, the absolute value in temperature coefficient (of) of resonance frequency becomes more than 20 ppm/° C. Further, it is unfavorable that the molar fraction d in the main component exceeds 30.0 mol %. In this case, the $Q \times f_0$ value becomes smaller. The dielectric ceramic composition according to the present embodiment may contain other components in addition to the main component thereof as far as the object of the present invention is not impaired.

When the molar fraction d in the main component is 0 mol %, the main component of the dielectric ceramic composition according to the present embodiment is represented by the formula: $aZnAl_2O_4$-$bZn_2SiO_4$-$cTiO_2$ (a+b+c=100 mol %). The dielectric ceramic composition containing a glass component in an amount of 5 to 150 parts by weight based on 100 parts by weight of the three-phase main component can also obtain the effect of the present invention.

The dielectric ceramic composition comprising a main component containing crystals of four components represented by $aZnAl_2O_4$-$bZn_2SiO_4$-$cTiO_2$-$dZn_2TiO_4$ and a glass component can be taken as the most preferable form in the present embodiment. The addition of the $Zn_2TiO_4$ to the dielectric ceramic composition comprising crystals of the three-phase main component represented by $aZnAl_2O_4$-$bZn_2SiO_4$-$cTiO_2$ and glass component can lower the sintering temperature and, in particular, makes it harder for a defect such as a migration to occur in the case of simultaneous sintering with Ag which is low melting metal.

A preferable production method of the dielectric ceramic composition according to the present embodiment and dielectric ceramics obtained by sintering the same will next be described. The respective base materials constituting the main component are obtained as follows. $ZnAl_2O_4$ is obtained by mixing ZnO and $Al_2O_3$ in a molar ratio of 1:1 followed by calcination. $Zn_2SiO_4$ is obtained by mixing ZnO and $SiO_2$ in a molar ratio of 2:1 followed by calcination. $Zn_2TiO_4$ is obtained by mixing ZnO and $TiO_2$ in a molar ratio of 2:1 followed by calcination. Predetermined amounts of the required base materials of the above $ZnAl_2O_4$, $Zn_2SiO_4$, $TiO_2$ and $Zn_2TiO_4$ and glass powder are wet-mixed together with a solvent such as water or an alcohol. Subsequently, after removing the water, the alcohol or the like, an organic binder such as polyvinyl alcohol and water are mixed in the resulting powder. The mixture is rendered uniform, dried and pulverized, followed by molding under pressure (pressure: on the order of from 100 to 1000 kg/cm$^2$). The molded product obtained is sintered at from 825 to 925° C. in an oxygen-containing gas atmosphere such as air atmosphere, whereby the dielectric ceramics represented by the above composition formula can be obtained.

Further, another example of the preferable production method of the dielectric ceramic composition according to the present embodiment and dielectric ceramics obtained by sintering the same will next be described. Predetermined amounts of the required starting materials of respective powders: zinc oxide (ZnO), aluminium oxide ($Al_2O_3$), silicon oxide ($SiO_2$), and titanium oxide ($TiO_2$) are wet-mixed together with a solvent such as water or an alcohol. Subsequently, after removing the water, the alcohol, or the like, the mixture is calcined at from 800 to 1200° C. for 2 hours in air atmosphere to obtain a calcined powder comprising $ZnAl_2O_4$, $Zn_2SiO_4$, $TiO_2$, and $Zn_2TiO_4$. A predetermined amount of the glass powder is added to thus-obtained calcined powder followed by wet-mixing together with a solvent such as water or an alcohol. Subsequently, after removing the water, the alcohol, or the like, an organic binder such as polyvinyl alcohol and water are mixed in the resulting powder. The mixture is rendered uniform, dried and pulverized, followed by molding under pressure (pressure: on the order of from 100 to 1000 kg/cm$^2$). The molded product obtained is sintered at from 825 to 925° C. in an oxygen-containing gas atmosphere such as air atmosphere, whereby the dielectric ceramics represented by the above composition formula can be obtained. As materials of zinc, aluminium, silicon, and titanium, carbonate, hydroxide, and an organic metal compound each turning into an oxide at the time of calcining, may also be used, in addition to ZnO, $Al_2O_3$, $SiO_2$, and $TiO_2$.

Figure 3:
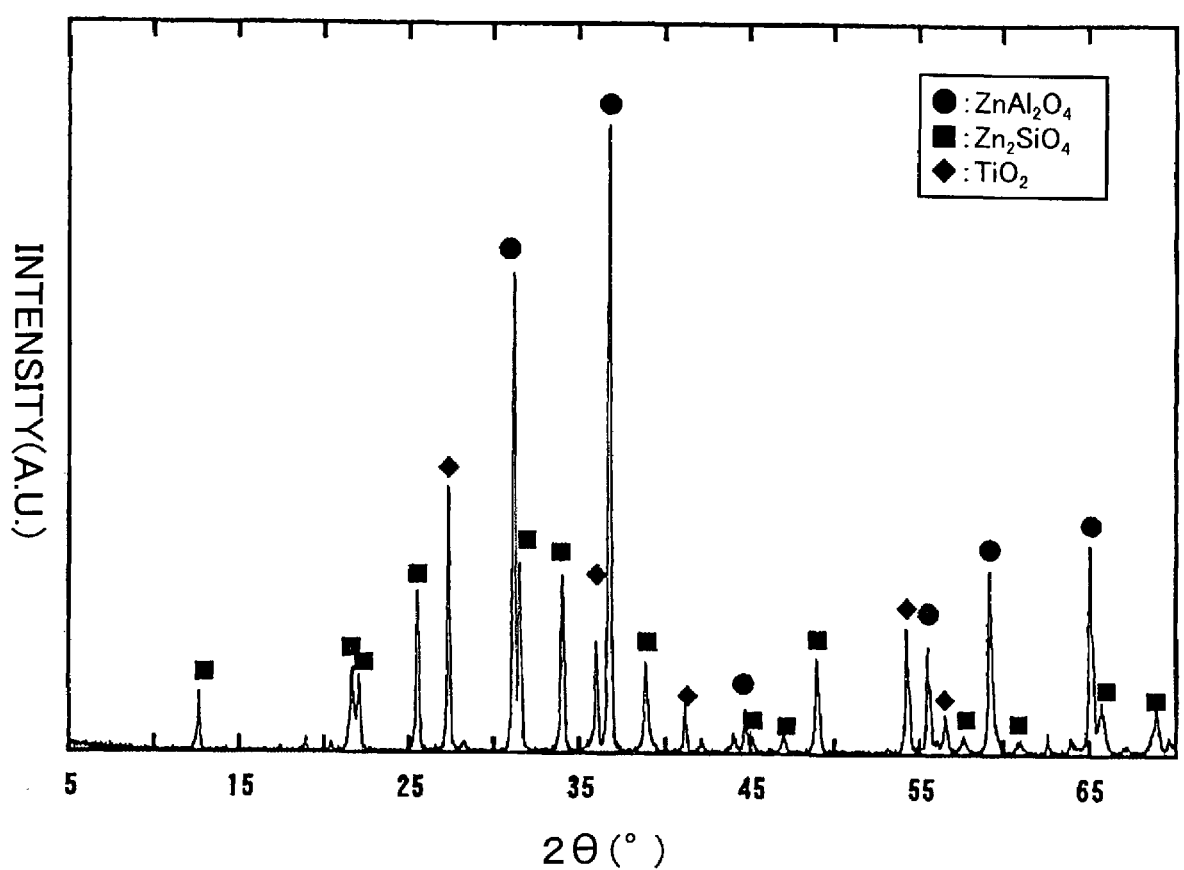
FIG. 3 is an X-ray diffraction pattern of dielectric ceramics obtained in example 2.
Figure 4:
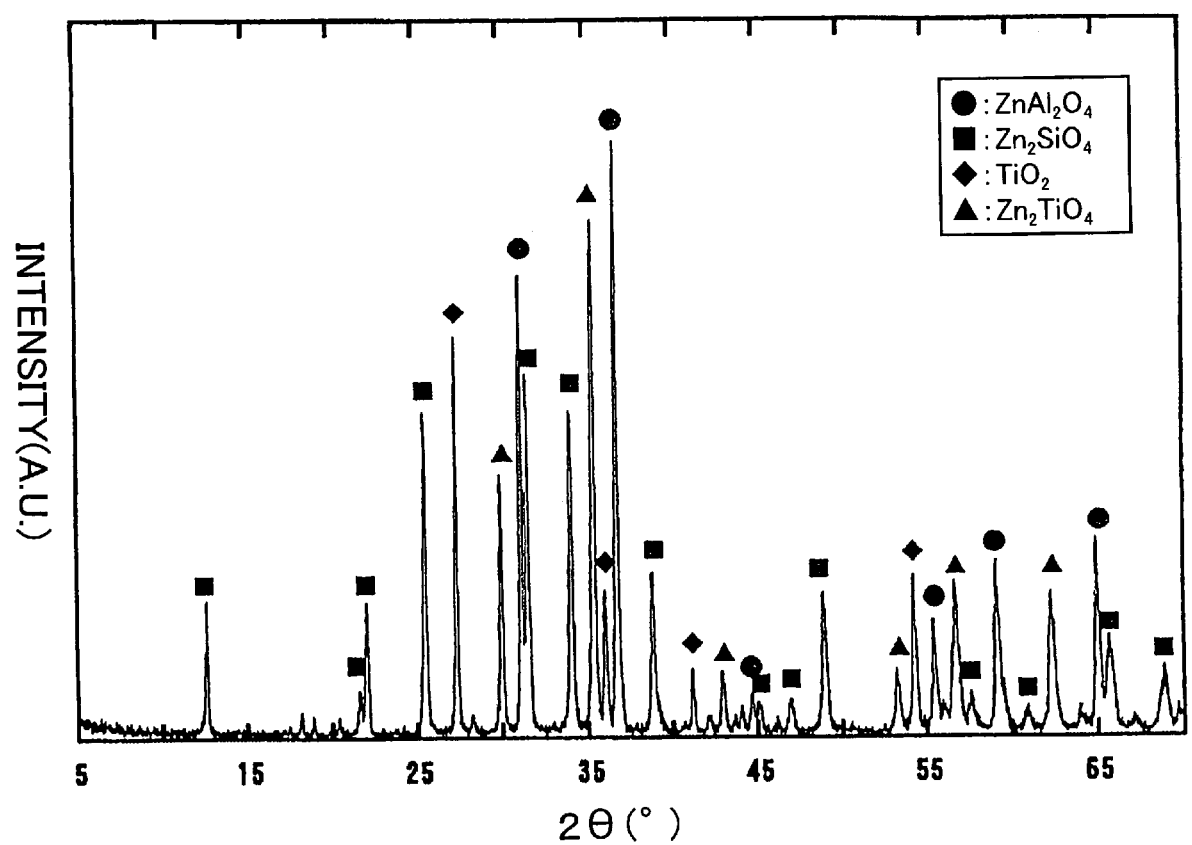
FIG. 4 is an X-ray diffraction pattern of dielectric ceramics obtained in example 13.

FIG. 3 shows an X-ray diffraction pattern of the dielectric ceramics according to the present embodiment comprising crystals of the three-phase main component represented by $aZnAl_2O_4$-$bZn_2SiO_4$-$cTiO_2$ and glass phase, which is obtained by the former production method. FIG. 4 shows an X-ray diffraction pattern of the dielectric ceramics according to the present embodiment comprising crystals of the four-phase main component represented by $aZnAl_2O_4$-$bZn_2SiO_4$-$cTiO_2$-$dZn_2TiO_4$ and glass phase, which is obtained by the former production method. Note that it is possible to obtain the dielectric ceramics having the target crystalline structure by using the latter production method in which the oxides are used as starting materials, as well as by using the production method in which carbonate, hydroxide, and an organic metal compound each turning into an oxide at the time of calcining are used as the starting materials.

The dielectric ceramic composition according to the present embodiment is utilized for manufacturing a dielectric resonator. More specifically, the dielectric ceramic composition is processed in an appropriate shape and size, and sintered, followed by formation of required electrodes. Further, the dielectric ceramic composition according to the present embodiment is utilized to obtain various types of laminated ceramic parts. More specifically, resin such as polyvinyl butyral, a plasticizer such as dibutylphthalate, organic solvent such as toluene are mixed in the dielectric ceramic composition, followed by sheet forming using a doctor blade method. The obtained sheet and a conductor are laminated and sintered in an integrated manner. Examples of the laminated dielectric parts include a laminated dielectric resonator, a laminated ceramic condenser, an LC filter, and a dielectric substrate.

The laminated ceramic part according to the present embodiment comprises a plurality of dielectric layers, an internal electrode formed between the dielectric layers and an external electrode electrically connected to the internal electrode. The dielectric layers are constituted of dielectric ceramics obtained by sintering the dielectric ceramic composition and the internal electrode is made of elemental Cu or elemental Ag, or an alloy material mainly comprising Cu or Ag. The laminated ceramic parts according to the present embodiment can be obtained by simultaneously sintering the dielectric layers each containing the dielectric ceramic composition and elemental Cu, elemental Ag or an alloy material mainly comprising Cu or Ag.

Figure 2:
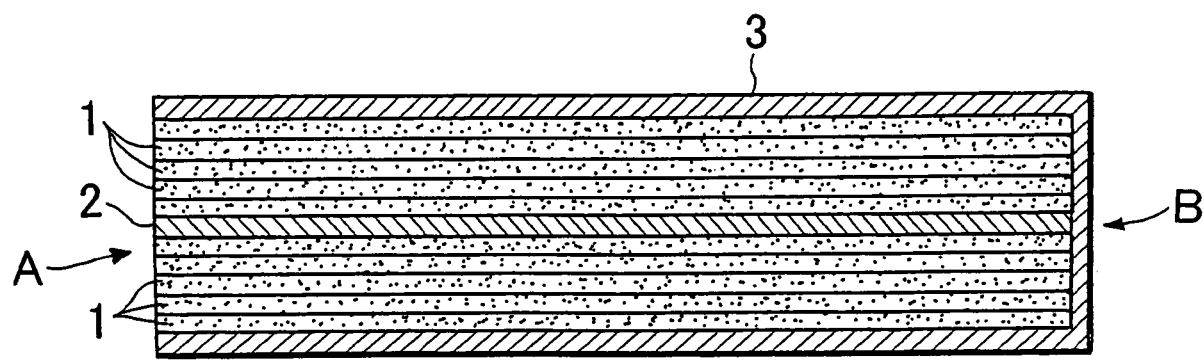
FIG. 2 is a cross-sectional view of the laminated ceramic part of FIG. 1.

Examples of one embodiment of the laminated ceramic parts include a tri-plate type resonator shown in FIG. 1. FIG. 1 is a perspective view showing the tri-plate type resonator according to the present embodiment, and FIG. 2 is a cross-sectional view of the resonator. As shown in FIGS. 1 and 2, the tri-plate type resonator is a laminated ceramic part comprising a plurality of dielectric layers 1, an internal electrode 2 formed between the dielectric layers and an external electrode 3 electrically connected to the internal electrode. The internal electrode 2 is disposed at the center of the laminated dielectric layers 1. The internal electrode 2 is formed so as to pass through the resonator from a first face A to a second face B opposing the first face A. Only the first face A is an open face. Five faces of the resonator exclusive of the first face A are covered by an external electrode 3, and the internal electrode 2 and the external electrode 3 are connected to each other on the second face B. The material of the internal electrode 2 contains Cu or Ag, or an alloy material mainly comprising Cu or Ag. When the dielectric ceramic composition according to the present embodiment is used, the sintering can be performed at a low temperature and therefore, these materials for the internal electrode can be used to perform simultaneous sintering.

(2) SECOND EMBODIMENT (Embodiment Related to a Dielectric Ceramic Composition Comprising a Calcined Body of a Material Composition Represented by the above General Formula (2) as a Main Component)

A dielectric ceramic composition according to the present embodiment comprises a calcined body obtained by calcining a material composition represented by the general formula (2): $aZnO$-$bAl_2O_3$-$cSiO_2$-$d(xCaO$-$(1-x)TiO_2)$ as a main component and contains, as a subcomponent, a Li compound in an amount of 2 to 30 parts by weight in terms of $Li_2O$ based on 100 parts by weight of the main component and contains a glass component in an amount of 5 to 150 parts by weight based on 100 parts by weight of the main component.

The calcined body as the main component is obtained by calcining a predetermined amount of the material, which can be represented by the above general formula (2), comprising ZnO, $Al_2O_3$, $SiO_2$, and $TiO_2$, and if necessary, CaO at from 900 to 1200° C. The obtained calcined body contains a $ZnAl_2O_4$ crystal and a $Zn_2SiO_4$ crystal and further contains a crystal of $CaTiO_3$ when the material composition contains CaO. Crystals of $CaAl_2Si_2O_8$, $Zn_2TiO_4$, $ZnTiO_3$, $Zn_2Ti_3O_8$, and $TiO_2$ may be contained, depending on the material composition in some cases.

The glass component to be mixed in the dielectric ceramic composition according to the present embodiment includes a PbO-base glass, a ZnO-base glass, a $SiO_2$-base glass, a $B_2O_3$-base glass, as in the case of the first embodiment. Further, as the glass component according to the present embodiment, a glass comprising various metal oxides can be used, and examples thereof include a glass comprising two or more oxides selected from the group consisting of $SiO_2$, $Al_2O_3$, ZnO, PbO, $Bi_2O_3$, BaO, SrO, $SnO_2$, $ZrO_2$, and $B_2O_3$. Either an amorphous glass or a crystalline glass may be used as the glass. When the glass contains PbO, the sintering temperature is liable to lower, however, the unloaded Q-value is liable to decrease and therefore, the content of the PbO component in the glass is preferably 40% by weight or less. A glass containing a ZnO component, an $Al_2O_3$ component, a BaO component, a $SiO_2$ component, and a $B_2O_3$ component is more preferably used as the glass for use in the present embodiment in that a high unloaded Q-value can be obtained.

An example of a glass composition most preferably used includes one containing $SiO_2$ in an amount of 2.5 to 70 wt %, $Al_2O_3$ in an amount of 0 to 15 wt %, ZnO in an amount of 10 to 55 wt %, PbO in an amount of 0 to 35 wt %, $Bi_2O_3$ in an amount of 0 to 2 wt %, BaO in an amount of 0 to 5 wt %, SrO in an amount of 0 to 2 wt %, $SnO_2$ in an amount of 0 to 2 wt %, $ZrO_2$ in an amount of 0 to 1 wt %, and $B_2O_3$ in an amount of 10 to 50 wt %.

Reasons for limiting the composition in the present embodiment will next be described. If the glass component is contained in an amount of less than 5 parts by weight based on 100 parts by weight of the main component served as the base material of the ceramics, a preferable sintered body cannot be obtained at 1000° C. or less; whereas if the glass component is contained in excess of 150 parts by weight, the glass is liable to elute in sintering, with the result that a preferable sintered body cannot be obtained. In the present embodiment, it is most preferable that the glass component be contained in an amount of 10 to 50 parts by weight. This content can lower the sintering temperature and, in particular, makes it harder for a defect such as a migration to occur in the case of simultaneous sintering with Ag which is low melting metal and, at the same time, $Q \times f_0$ value is increased. It is unfavorable that the content of $Li_2O$ to be contained as a subcomponent is less than 2 parts by weight based on 100 parts by weight of the main component, or the content thereof exceeds 30 parts by weight. In the former case, a preferable sintered body cannot be obtained at 1000° C. or less; in the latter case, the glass is liable to elute in sintering with the result that a preferable sintered body cannot be obtained.

It is unfavorable that the molar fraction a in the main component material is less than 7.5 mol %, or it exceeds 55.0 mol %. In the former case, a preferable sintered body cannot be obtained at 1000° C. or less; in the latter case, the $Q \times f_0$ value becomes less than 10000 (GHz). Further, it is unfavorable that the molar fraction b in the main component material is less than 5.0 mol %, or it exceeds 65.0 mol %. In the former case, the $Q \times f_0$ value becomes less than 10000 (GHz); in the latter case, a preferable sintered body cannot be obtained at 1000° C. or less. Further, it is unfavorable that the molar fraction c in the main component material is less than 5.0 mol %, or it exceeds 70.0 mol %. In the former case, a preferable sintered body cannot be obtained at 1000° C. or less; in the latter case, the $Q \times f_0$ value becomes less than 10000 (GHz). Further, it is unfavorable that the molar fraction d in the main component material is less than 7.5 mol % or exceeds 27.5 mol %. In this case, the absolute value in temperature coefficient $(\tau_f)$ of resonance frequency becomes more than 20 ppm/° C. Further, it is unfavorable that the value of x exceeds 0.75. In this case, the $Q \times f_0$ value becomes less than 10000 (GHz) and the absolute value in temperature coefficient $(\tau_f)$ of resonance frequency becomes more than 20 ppm/° C. The dielectric ceramic composition according to the present embodiment may contain other components in addition, to the main component thereof as far as the object of the present invention is not impaired.

When the value of x is 0 in the above formula (2), the main component material of the dielectric ceramic composition according to the present embodiment is represented by the formula: $aZnO$-$bAl_2O_3$-$cSiO_2$-$dTiO_2$ ($a+b+c+d=100$ mol %). The dielectric ceramic composition containing a Li compound as a subcomponent in an amount of 2 to 30 parts by weight in terms of $Li_2O$ based on 100 parts by weight of the calcined body obtained from the four-phase main component material and a glass component in an amount of 5 to 150 parts by weight based on 100 parts by weight of the main component can also obtain the effect of the present invention.

The dielectric ceramic composition comprising a calcined body obtained from the main component material of the five-phase component represented by ZnO—$Al_2O_3$—$SiO_2$—CaO—$TiO_2$ and $Li_2O$ as a subcomponent in an amount of 2 to 30 parts by weight based on 100 parts by weight of the calcined body and a glass component in an amount of 5 to 150 parts by weight based on 100 parts by weight of the main component can be taken as the most preferable form in the present embodiment.

The dielectric ceramic composition comprising a calcined body obtained from the main component material of the five-phase component, $Li_2O$ as a subcomponent, and a glass component can further lower the sintering temperature and, in particular, makes it harder for a defect such as a migration to occur in the case of simultaneous sintering with Ag which is low melting metal, as compared to the dielectric ceramic composition comprising a calcined body obtained from the main component material of the four-phase component, $Li_2O$ as a subcomponent, and a glass component.

A preferable production method of the dielectric ceramic composition according to the present embodiment and dielectric ceramics obtained by sintering the same will next be described. The respective base materials constituting the main component are obtained as follows. The required base materials of the above ZnO, $Al_2O_3$, $SiO_2$, CaO, and $TiO_2$ are weighed in predetermined amounts and wet-mixed together with a solvent such as water or an alcohol. Subsequently, after removing the water, the alcohol or the like, the obtained powder is calcined at from 900 to 1200° C. Thus-obtained calcined powder of the main component, $Li_2O$ powder as a subcomponent, and a glass powder are weighed in predetermined amounts and wet-mixed together with a solvent such as water or an alcohol. Subsequently, after removing the water, the alcohol or the like, an organic binder such as polyvinyl alcohol and water are mixed in the resulting powder. The mixture is rendered uniform, dried and pulverized, followed by molding under pressure (pressure: on the order of from 100 to 1000 kg/cm$^2$). The molded product obtained is sintered at from 850 to 975° C. in an oxygen-containing gas atmosphere such as air atmosphere, whereby the dielectric ceramics according to the present embodiment can be obtained.

Figure 5:
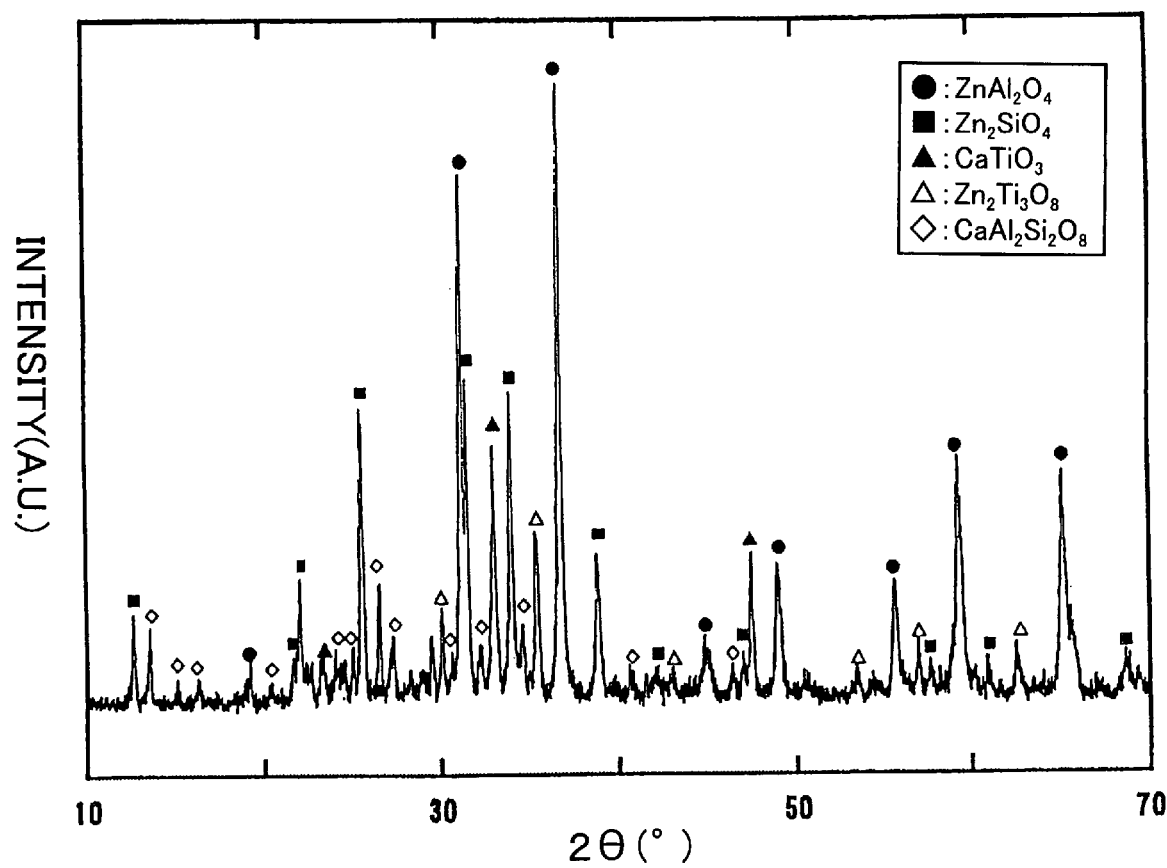
FIG. 5 is an X-ray diffraction pattern of dielectric ceramics obtained in example 33.

FIG. 5 shows an X-ray diffraction pattern of the dielectric ceramics according to the present embodiment which is obtained by mixing $Li_2O$ as a subcomponent and glass component with the calcined powder of the main component material of the five-phase component represented by ZnO—$Al_2O_3$—$SiO_2$—CaO—$TiO_2$ and sintering them. As can be seen from FIG. 5, the dielectric ceramics according to the present embodiment comprises crystalline phases of $ZnAl_2O_4$, $Zn_2SiO_4$, $CaTiO_3$, $CaAl_2Si_2O_8$ and $Zn_2TiO_3O_8$ and a glass phase.

The dielectric ceramic composition according to the present embodiment is utilized for manufacturing a dielectric resonator, as in the case of the first embodiment. Further, as in the case of the first embodiment, various types of laminated ceramic parts such as a tri-plate type resonator can be obtained from the dielectric ceramic composition according to the present embodiment.

(3) THIRD EMBODIMENT (Embodiment Related to a Dielectric Ceramic Composition Comprising a Composition Represented by the above General Formula (3) as a Main Component)

A dielectric ceramic composition according to the present embodiment contains a Li compound as a subcomponent in an amount of 2 to 30 parts by weight in terms of $Li_2O$ based on 100 parts by weight of the main component represented by the general formula (3): $aZnAl_2O_4$-$bZn_2SiO_4$-$cSiO_2$-$dSrTiO_3$ and a glass component in an amount of 5 to 150 parts by weight based on 100 parts by weight of the main component.

The glass component to be mixed in the dielectric ceramic composition according to the present embodiment is the same as that in the second embodiment. When the glass contains PbO, the sintering temperature is liable to lower, however, the unloaded Q-value is liable to decrease and therefore, the content of the PbO component in the glass is preferably 40% by weight or less. A glass containing a ZnO component, an $Al_2O_3$ component, a BaO component, an $SiO_2$ component, and a $B_2O_3$ component is more preferably used as the glass for use in the present embodiment in that a high unloaded Q-value can be obtained.

An example of a glass composition most preferably used includes one containing $SiO_2$ in an amount of 2.5 to 70 wt %, $Al_2O_3$ in an amount of 0 to 15 wt %, ZnO in an amount of 10 to 55 wt %, PbO in an amount of 0 to 35 wt %, $Bi_2O_3$ in an amount of 0 to 2 wt %, BaO in an amount of 0 to 5 wt %, SrO in an amount of 0 to 2 wt %, $SnO_2$ in an amount of 0 to 2 wt %, $ZrO_2$ in an amount of 0 to 1 wt %, and $B_2O_3$ in an amount of 10 to 50 wt %.

Reasons for limiting the composition in the present embodiment will next be described. If the glass component is contained in an amount of less than 5 parts by weight based on 100 parts by weight of the main component served as the base material of the ceramics, a preferable sintered body cannot be obtained at 1000° C. or less; whereas if the glass component is contained in excess of 150 parts by weight, the glass is liable to elute in sintering, with the result that a preferable sintered body cannot be obtained. In the present embodiment, it is more preferable that the glass component be contained in an amount of 20 to 50 parts by weight. This content can lower the sintering temperature and, in particular, makes it harder for a defect such as a migration to occur in the case of simultaneous sintering with Ag which is low melting metal and, at the same time, $Q \times f_0$ value is increased. It is unfavorable that the content of Li compound to be contained as a subcomponent is less than 2 parts by weight in terms of $Li_2O$, based on 100 parts by weight of the main component, or it exceeds 30 parts by weight. In the former case, a preferable sintered body cannot be obtained at 1000° C. or less; in the latter case, the glass is liable to elute in sintering with the result that a preferable sintered body cannot be obtained.

It is unfavorable that the molar fraction a in the main component is less than 2.5 mol %, or it exceeds 77.5 mol %. In the former case, the $Q \times f_0$ value becomes less than 10000 (GHz); in the latter case, a preferable sintered body cannot be obtained at 1000° C. or less. Further, it is unfavorable that the molar fraction b in the main component is less than 2.5 mol %, or it exceeds 77.5 mol %. In the former case, a preferable sintered body cannot be obtained at 1000° C. or less; in the latter case, the $Q \times f_0$ value becomes less than 10000 (GHz). Further, it is unfavorable that the molar fraction c in the main component is less than 2.5 mol %, or it exceeds 37.5 mol %. In the former case, a preferable sintered body cannot be obtained at 1000° C. or less; in the latter case, the $Q \times f_0$ value becomes less than 10000 (GHz). Further, it is unfavorable that the molar fraction d in the main component is less than 10.0 mol % or exceeds 17.5 mol %. In this case, the absolute value in temperature coefficient ($\tau_f$) of resonance frequency becomes more than 20 ppm/° C. The dielectric ceramic composition may contain other components in addition to the main component thereof as far as the object of the present invention is not impaired.

A preferable production method of the dielectric ceramic composition according to the present embodiment and dielectric ceramics obtained by sintering the same will next be described. The respective components of $ZnAl_2O_4$, $Zn_2SiO_4$, $SiO_2$, $SrTiO_3$ that constitute the main component of the dielectric ceramic composition according to the present embodiment can be prepared individually, or can be prepared at a time as a mixture. When the respective components are individually prepared, oxides of each element are mixed in a predetermined ratio, followed by calcination. For example, $ZnAl_2O_4$ is obtained by mixing ZnO and $Al_2O_3$ in a molar ratio of 1:1 followed by calcination at from 900 to 1200° C. Similarly, $Zn_2SiO_4$ is obtained by mixing ZnO and $SiO_2$ in a molar ratio of 2:1 followed by calcination. $SrTiO_3$ is obtained by mixing SrO and $TiO_2$ in a molar ratio of 1:1 followed by calcination.

When the main component of the dielectric ceramic composition is to be prepared at a time as a mixture, it can be obtained as follows. That is, predetermined amounts of the required starting materials of respective powders: zinc oxide (ZnO), aluminium oxide ($Al_2O_3$), silicon oxide ($SiO_2$), strontium oxide (SrO), titanium oxide ($TiO_2$) are wet-mixed together with a solvent such as water or an alcohol. Subsequently, after removing the water, the alcohol, or the like, the mixture is calcined at from 900 to 1200° C. for 2 hours in air atmosphere to obtain a calcined powder comprising $ZnAl_2O_4$, $Zn_2SiO_4$, $SiO_2$, and $SrTiO_3$. As materials of zinc, aluminium, silicon, strontium, and titanium, carbonate, hydroxide, and an organic metal compound each turning into an oxide at the time of calcining, may also be used, in addition to ZnO, $Al_2O_3$, $SiO_2$, SrO, and $TiO_2$.

The $Li_2O$ powder as a subcomponent and glass powder are mixed with the main component comprising the calcined powder obtained in the manner as described above, whereby obtaining the dielectric ceramic composition according to the present embodiment. In the present embodiment, the same amount in terms of $Li_2O$ of a compound turning into $Li_2O$ at the time of calcining, such as $Li_2CO_3$ can be used in place of $Li_2O$.

When the dielectric ceramics is to be obtained by sintering the dielectric ceramic composition, the following procedure is required. That is, $ZnAl_2O_4$, $Zn_2SiO_4$, $SiO_2$, and $SrTiO_3$ as a main component, a $Li_2O$ powder as a subcomponent and a glass powder are weighed in predetermined amounts and wet-mixed together with a solvent such as water or an alcohol. Subsequently, after removing the water, the alcohol or the like, an organic binder such as polyvinyl alcohol and water are mixed in the resulting powder. The mixture is rendered uniform, dried and pulverized, followed by molding under pressure (pressure: on the order of from 100 to 1000 kg/cm$^2$). The molded product obtained is sintered at from 825 to 975° C. in an oxygen-containing gas atmosphere such as air atmosphere, whereby the dielectric ceramics comprising crystalline phases of $ZnAl_2O_4$, $Zn_2SiO_4$, and $SrTiO_3$ and a glass phase can be obtained.

Figure 6:
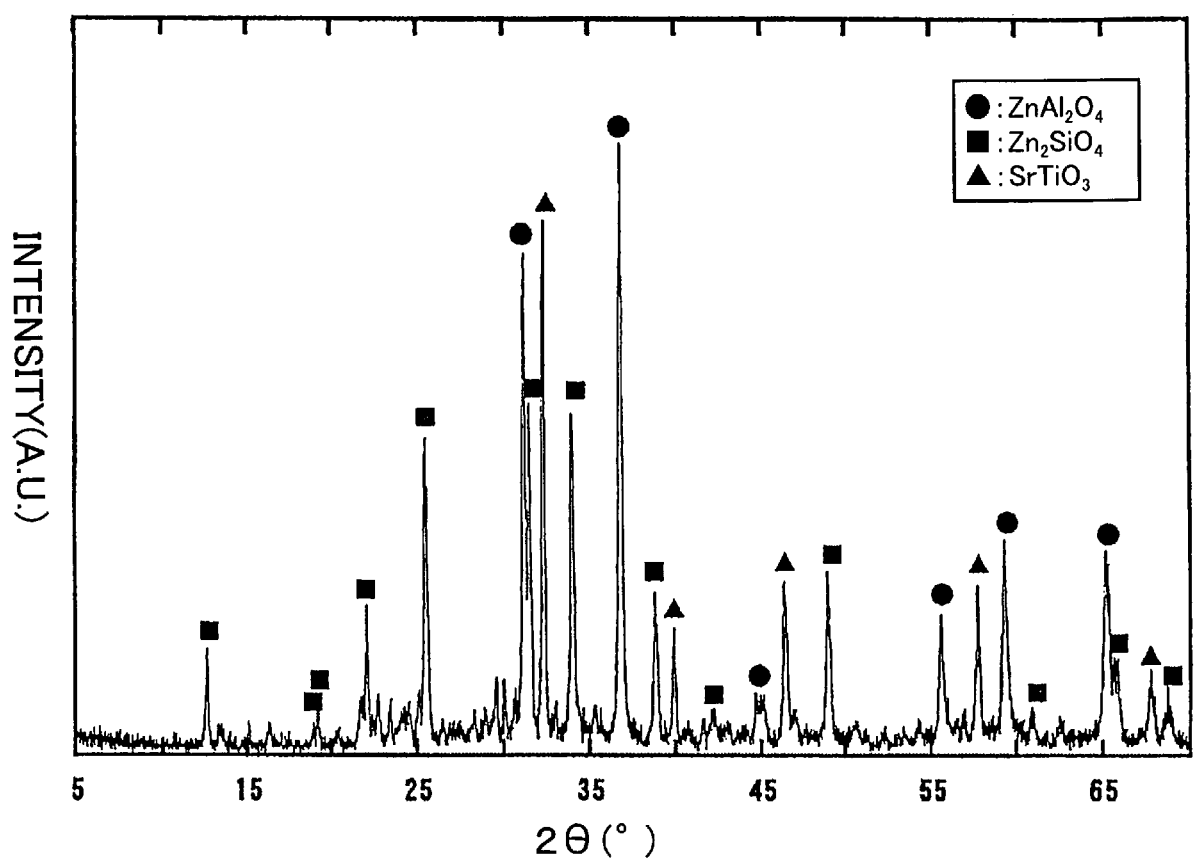
FIG. 6 is an X-ray diffraction pattern of dielectric ceramics obtained in example 44.

FIG. 6 shows an X-ray diffraction pattern of the dielectric ceramics according to the present embodiment which is obtained by mixing $Li_2O$ as a subcomponent and glass component with the calcined powder of the main component represented by $aZnAl_2O_4$-$bZn_2SiO_4$-$cSiO_2$-$dSrTiO_3$ and sintering them. As can be seen from FIG. 6, the dielectric ceramics according to the present embodiment comprises crystalline phases of $ZnAl_2O_4$, $Zn_2SiO_4$, and $SrTiO_3$ and a glass phase. A $SiO_2$ crystal in the main component performs an important role in sintering. When the $SiO_2$ crystal is not contained in the main component, the mixture cannot be sintered sufficiently at a low temperature. It is estimated that the $SiO_2$ crystal contained in the main component before sintering, which is not detected by the X-ray diffraction after sintering, becomes amorphous after sintering. Similarly, $Li_2O$ as a subcomponent is not detected by the X-ray diffraction after sintering and is estimated to become amorphous after sintering. The dielectric ceramics according to the present embodiment comprises the crystalline phases of $ZnAl_2O_4$, $Zn_2SiO_4$, and $SrTiO_3$, tiny amount of another crystalline phase may exist as far as the effects of the present invention are not impaired. It is possible to obtain the above crystalline structure by the production method in which the oxides are used as starting materials, as well as by using the production method in which carbonate, hydroxide, and an organic metal compound each turning into an oxide at the time of calcining are used as the stating materials.

The dielectric ceramic composition according to the present embodiment is utilized for manufacturing a dielectric resonator, as in the case of the first embodiment. Further, as in the case of the first embodiment, various types of laminated ceramic parts such as a tri-plate type resonator can be obtained from the dielectric ceramic composition according to the present embodiment.

(4) FOURTH EMBODIMENT (Embodiment Related to a Dielectric Ceramic Composition Comprising a Composition Represented by the above General Formula (4) as a Main Component)

A dielectric ceramic composition according to the present embodiment contains a Li compound as a subcomponent in an amount of 1 to 15 parts by weight in terms of $Li_2O$ based on 100 parts by weight of the main component represented by the general formula (4): $aMg_2SiO_4$-$bZnAl_2O_4$-$cSiO_2$-$dCaTiO_3$-$eZn_2SiO_4$ and a glass component in an amount of 5 to 150 parts by weight based on 100 parts by weight of the main component.

It is unfavorable that the molar fraction a in the main component is less than 0.10, or it exceeds 0.72. In the former case, a preferable sintered body cannot be obtained at 1000° C. or less; in the latter case, the $Q \times f_0$ value becomes less than 10000 (GHz). Further, it is unfavorable that the molar fraction b in the main component is less than 0.08, or it exceeds 0.62. In the former case, the $Q \times f_0$ value becomes less than 10000 (GHz); in the latter case, a preferable sintered body cannot be obtained at 1000° C. or less. Further, it is unfavorable that the molar fraction c in the main component is less than 0.02, or it exceeds 0.22. In the former case, a preferable sintered body cannot be obtained at 1000° C. or less; in the latter case, the $Q \times f_0$ value becomes less than 10000 (GHz). Further, it is unfavorable that the molar fraction d in the main component is less than 0.12 or exceeds 0.22. In this case, the absolute value in temperature coefficient (of) of resonance frequency becomes more than 20 ppm/° C. Further, it is unfavorable that the molar fraction e in the main component exceeds 0.08. In this case, the $Q \times f_0$ value becomes less than 10000 (GHz). The dielectric ceramic composition according to the present embodiment may contain other components in addition to the main component thereof as far as the object of the present invention is not impaired.

In the dielectric ceramic composition according to the present embodiment, the Li compound used as a subcomponent includes $Li_2O$, as well as carbonate, hydroxide, and an organic metal compound each turning into an oxide at the time of calcining. In general, $Li_2O$ or $Li_2CO_3$ is used. The amount to be added of the subcomponent is determined as above in terms of $Li_2O$.

As in the case of the first embodiment, the glass component to be mixed in the dielectric ceramic composition according to the present embodiment includes a PbO-base glass, a ZnO-base glass, a $SiO_2$-base glass, a $B_2O_3$-base glass. In addition to the above, a glass comprising various metal oxides can also be used, and examples thereof include a glass comprising two or more oxides selected from the group consisting of $SiO_2$, $Al_2O_3$, ZnO, PbO, $Bi_2O_3$, BaO, SrO, $SnO_2$, $ZrO_2$, and $B_2O_3$. Either an amorphous glass or a crystalline glass may be used as the glass. When the glass contains PbO, the sintering temperature is liable to lower, however, the unloaded Q-value is liable to decrease and therefore, the content of the PbO component in the glass is preferably 40% by weight or less. A glass containing a ZnO component, an $Al_2O_3$ component, a BaO component, an $SiO_2$ component, and a $B_2O_3$ component is more preferably used as the glass for use in the present embodiment in that a high unloaded Q-value can be obtained.

An example of a glass composition most preferably used includes one containing $SiO_2$ in an amount of 2 to 70 wt %, $Al_2O_3$ in an amount of 0 to 15 wt %, ZnO in an amount of 10 to 55 wt %, PbO in an amount of 0 to 35 wt %, $Bi_2O_3$ in an amount of 0 to 2 wt %, BaO in an amount of 0 to 30 wt %, SrO in an amount of 0 to 2 wt %, $SnO_2$ in an amount of 0 to 2 wt %, $ZrO_2$ in an amount of 0 to 1 wt %, and $B_2O_3$ in an amount of 10 to 50 wt %. The use of the above glass composition allows the sintering at a low temperature of 950° C. or less.

If the glass component is contained in an amount of less than 5 parts by weight based on 100 parts by weight of the main component served as the base material of the ceramics, a preferable sintered body cannot be obtained at 1000° C. or less; whereas if the glass component is contained in excess of 150 parts by weight, the glass is liable to elute in sintering, with the result that a preferable sintered body cannot be obtained. In the present embodiment, it is most preferable that the glass component be contained in an amount of 10 to 50 parts by weight. This content can lower the sintering temperature and, in particular, makes it harder for a defect such as a migration to occur in the case of simultaneous sintering with Ag which is low melting metal and, at the same time, $Q \times f_0$ value is increased. It is unfavorable that the content of the subcomponent is less than 1 part by weight in terms of $Li_2O$ based on 100 parts by weight of the main component, or it exceeds 15 parts by weight. In the former case, a preferable sintered body cannot be obtained at 1000° C. or less; in the latter case, the glass is liable to elute in sintering with the result that a preferable sintered body cannot be obtained.

When the molar fraction e of the main component is 0, the main component of the dielectric ceramic composition according to the present embodiment is represented by the formula: $aMg_2SiO_4$-$bZnAl_2O_4$-$cSiO_2$-$dCaTiO_3$, and the respective molar fractions of a, b, c, and d are represented by: $0.10 \leq a \leq 0.72$, $0.08 \leq b \leq 0.62$, $0.02 \leq c \leq 0.22$, and $0.12 \leq d \leq 0.22$ (a+b+c+d=1). The dielectric ceramic composition comprising a Li compound to be contained as a subcomponent in an amount of 1 to 15 parts by weight in terms of $Li_2O$ and a glass component in an amount of 5 to 150 parts by weight, based on 100 parts by weight of the four-phase main component can also obtain the effect of the present invention.

The dielectric ceramic composition comprising a five-phase main component: $aMg_2SiO_4$-$bZnAl_2O_4$-$cSiO_2$-$dCaTiO_3$-$eZn_2SiO_4$ and a Li compound to be contained as a subcomponent in an amount of 1 to 15 parts by weight in terms of $Li_2O$ based on 100 parts by weight of the main component and glass component in an amount of 5 to 150 parts by weight based on 100 parts by weight of the main component can be taken as the most preferable form in the present embodiment. The addition of the $Zn_2SiO_4$ to the dielectric ceramic composition comprising the four-phase main component can lower the sintering temperature and, in particular, makes it harder for a defect such as a migration to occur in the case of simultaneous sintering with Ag which is low melting metal.

The dielectric ceramics according to the present embodiment is obtained by sintering the dielectric ceramic composition. The obtained dielectric ceramics comprises crystalline phases of $Mg_2SiO_4$, $ZnAl_2O_4$, $SiO_2$, and $CaTiO_3$, and a glass phase. When the dielectric ceramic composition before sintering comprises $Zn_2SiO_4$, the obtained dielectric ceramics further comprises $Zn_2SiO_4$ as a crystalline phase. Although the compositions of the crystalline phase and glass phase substantially correspond to those constituting the dielectric ceramic composition, the surface of crystal grains and glass component are partly reacted to form a strong sintered body, as well as, the crystal component and glass component are partly reacted to generate at least one of the crystals of $Zn_2SiO_4$, $Li_2ZnSiO_4$, $CaTiSiO_5$, $Ca_2TiSiO_6$, $BaAl_2Si_2O_8$, and $Zn_2Ti_3O_8$, in some cases.

The dielectric ceramics according to the present embodiment exhibits a large $Q \times f_0$ value of 20000 (GHz) or more, which is a product of resonance frequency $f_0$ (GHz) and Q-value, and has a low dielectric loss. Further, the absolute value in temperature coefficient (if) of resonance frequency is not more than 20 ppm/° C., so that the influence of the temperature can be reduced. Further, dielectric constant $\epsilon_r$ is not more than 10, so that a high-frequency device or high-frequency circuit obtained using the dielectric ceramics is not excessively reduced in the size, but can be kept in an appropriate size. As a result, the dielectric ceramics according to the present embodiment is excellent in processing accuracy and productivity.

A preferable production method of the dielectric ceramic composition according to the present embodiment and dielectric ceramics obtained by sintering the same will next be described. The respective components of $Mg_2SiO_4$, $ZnAl_2O_4$, $SiO_2$, $CaTiO_3$, and $Zn_2SiO_4$ that constitute the main component of the dielectric ceramic composition according to the present embodiment can be prepared individually, or can be prepared at a time as a mixture. When the respective components are individually prepared, oxides of each element are mixed in a predetermined ratio, followed by calcination. For example, $Mg_2SiO_4$ is obtained by mixing MgO and $SiO_2$ in a molar ratio of 2:1 followed by calcination at from 900 to 1300° C. $ZnAl_2O_4$ is obtained by mixing ZnO and $Al_2O_3$ in a molar ratio of 1:1 followed by calcination at from 900 to 1300° C. $CaTiO_3$ is obtained by mixing CaO and $TiO_2$ in a molar ratio of 1:1 followed by calcination. $Zn_2SiO_4$ is obtained by mixing ZnO and $SiO_2$ in a molar ratio of 2:1 followed by calcination.

When the main component of the dielectric ceramic composition is to be prepared at a time as a mixture, it can be obtained as follows. That is, predetermined amounts of the required starting materials of respective powders: magnesium oxide (MgO), zinc oxide (ZnO), aluminium oxide ($Al_2O_3$), silicon oxide ($SiO_2$), calcium oxide (CaO), and titanium oxide ($TiO_2$) are wet-mixed together with a solvent such as water or an alcohol. Subsequently, after removing the water the alcohol, or the like, the mixture is calcined at from 900 to 1300° C. for 2 hours in air atmosphere to obtain a calcined powder comprising $Mg_2SiO_4$, $ZnAl_2O_4$, $SiO_2$, $CaTiO_3$, and $Zn_2SiO_4$. As materials of magnesium, zinc, aluminium, silicon, calcium, and titanium, carbonate, hydroxide, and an organic metal compound each turning into an oxide at the time of calcining, may also be used, in addition to MgO, ZnO, $Al_2O_3$, $SiO_2$, CaO, and $TiO_2$.

A Li compound turning into $Li_2O$ at the time of calcining such as lithium carbonate ($Li_2CO_3$) powder as a subcomponent and glass powder are mixed with the main component comprising the calcined powder obtained in the manner as described above, whereby the dielectric ceramic composition according to the present embodiment can be obtained.

When the dielectric ceramics is to be obtained by sintering the dielectric ceramic composition, the following procedure is required. That is, the required main component powders of $Mg_2SiO_4$, $ZnAl_2O_4$, $SiO_2$, $CaTiO_3$, and $Zn_2SiO_4$ and a powder of a Li compound, as a subcomponent, turning into $Li_2O$ at the time of calcining and glass powder are weighed in predetermined amounts and wet-mixed together with a solvent such as water or an alcohol. Subsequently, after removing the water, the alcohol or the like, an organic binder such as polyvinyl alcohol and water are mixed in the resulting powder. The mixture is rendered uniform, dried and pulverized, followed by molding under pressure (pressure: on the order of from 100 to 1000 $kg/cm^2$). The molded product obtained is sintered at from 800 to 950° C. in an oxygen-containing gas atmosphere such as air atmosphere, whereby the dielectric ceramics comprising crystalline phases of $Mg_2SiO_4$, $ZnAl_2O_4$, $SiO_2$, $CaTiO_3$, and a glass phase can be obtained. In some cases, the dielectric ceramics comprises at least one of the crystalline phases of $Li_2ZnSiO_4$, $CaTiSiO_5$, $Ca_2TiSiO_6$, $BaAl_2Si_2O_8$, and $Zn_2Ti_3O_8$, due to a reaction between the main component and subcomponent, or between the main component and glass component. These crystalline phases are optional components and, even if one of these exists, the effect of the present invention is not impaired.

FIG. 7 shows an X-ray diffraction pattern of the dielectric ceramics according to the present embodiment which is obtained by mixing $Li_2O$ as a subcomponent and glass component with the above calcined powder of the four-phase main component represented by $aMg_2SiO_4$-$bZnAl_2O_4$-$cSiO_2$-$dCaTiO_3$ and sintering them. FIG. 8 shows an X-ray diffraction pattern of the dielectric ceramics according to the present embodiment which is obtained by mixing the $Li_2O$ as a subcomponent and glass component with the calcined powder of the five-phase main component represented by $aMg_2SiO_4$-$bZnAl_2O_4$-$cSiO_2$-$dCaTiO_3$-$eZn_2SiO_4$ and sintering them.

As shown in FIGS. 7 and 8, the dielectric ceramics according to the present embodiment comprise at least one of the crystalline phases of $Li_2ZnSiO_4$, $CaTiSiO_5$, $Ca_2TiSiO_6$, $BaAl_2Si_2O_8$, and $Zn_2Ti_3O_8$, due to a reaction between the main component and subcomponent, or between the main component and glass component in addition to the crystalline phases of the main component containing $Mg_2SiO_4$, $ZnAl_2O_4$, $SiO_2$, and $CaTiO_3$, (in the case of FIG. 8, further containing $Zn_2SiO_4$) and glass phase. However, even if such a crystalline phase exists in the dielectric ceramic composition according to the present embodiment, the effect of the present invention is not impaired. Tiny amount of another crystalline phase may exist in addition to the above crystalline phases, as far as the effects of the present invention are not impaired. It is possible to obtain the above crystalline structure by the production method in which the oxides of each element are used as starting materials, as well as by using the production method in which carbonate, hydroxide, and an organic metal compound each turning into an oxide at the time of calcining are used as the stating materials.

The dielectric ceramic composition according to the present embodiment is utilized for manufacturing a dielectric resonator, as in the case of the first embodiment. Further, as in the case of the first embodiment, various types of laminated ceramic parts such as a tri-plate type resonator can be obtained from the dielectric ceramic composition according to the present embodiment.

Hereinafter, examples according to the present invention will be described.

(1) EXAMPLES AND COMPARATIVE EXAMPLES RELATED TO THE FIRST EMBODIMENT

Example 1

Respective powders of ZnO and $Al_2O_3$ were weighed so that the molar ratio between them became 1:1. The weighed powders were charged into a ball mill together with ethanol (solvent, the same in the following description) and $ZrO_2$ ball and wet-mixed for 24 hours. After removing the solvent from the solution, the resulting mixture was dried and calcined in air atmosphere at 1000° C. for 2 hours to obtain a powder of $ZnAl_2O_4$ crystal.

Similarly, respective powders of ZnO and $SiO_2$ were weighed so that the molar ratio between them became 2:1. The weighed powders were charged into a ball mill together with ethanol and $ZrO_2$ ball and wet-mixed for 24 hours. After removing the solvent from the solution, the resulting mixture was dried and calcined in air atmosphere at 1000° C. for 2 hours to obtain a powder of $Zn_2SiO_4$ crystal.

Subsequently, the powders of $ZnAl_2O_4$ and $Zn_2SiO_4$ thus obtained and $TiO_2$ powder were weighed in amounts of 7.5 mol %, 67.5 mol %, and 25 mol %, respectively. The weighed powders were then mixed to obtain the main component of the dielectric ceramic composition.

Powders of the main component and a glass powder were weighed in predetermined amounts (total amount of 150 g) so that the glass powder containing $SiO_2$ in an amount of 6.0 wt %, $Al_2O_3$ in an amount of 11.0 wt %, ZnO in an amount of 47.0 wt %, BaO in an amount of 4.0 wt %, SrO in an amount 0.2 wt %, CaO in an amount of 0.8 wt %, $SnO_2$ in an amount of 1.0 wt %, and $B_2O_3$ in an amount of 30.0 wt % became 30 parts by weight based on 100 parts by weight of the main component. The weighed powders were charged into a ball mill together with ethanol and $ZrO_2$ ball and wet-mixed for 24 hours. After removing the solvent from the solution, the resulting mixture was dried.

The obtained mixed powder (composition thereof is shown in Table 1) was pulverized. Then, to the pulverized product, an appropriate amount of a polyvinyl alcohol solution was added, followed by drying. Thereafter, the resulting pulverized product was molded into a pellet having a diameter of 10 mm and a thickness of 5 mm and the pellet obtained was sintered in air atmosphere at 925° C. for 2 hours, whereby the dielectric ceramics having the composition according to the present invention was obtained.

The thus-obtained dielectric ceramics were processed to a size of 8 mm in diameter and 4 mm in thickness and then measured by a dielectric resonance method to calculate the $Q \times f_0$ value at the resonance frequency of 9 to 13 GHz, the dielectric constant $\epsilon_r$, and the temperature coefficient $\tau_f$ of resonance frequency. The results thereof are shown in Table 2.

Also, to 100 g of the dry-mixed powder obtained by mixing the main component and the glass powder followed by solvent removal, 9 g of polyvinyl butyral as a binder, 6 g of dibutylphthalate as a plasticizer, and 60 g of toluene and 30 g of isopropyl alcohol both as a solvent were added to produce a green sheet having a thickness of 100 μm by the doctor blade method. Then, 20 layers of the green sheets were laminated by the thermo compression bonding of applying a pressure of 200 kg/cm² at a temperature of 65° C. At this time, a layer having been printed with Ag pattern as an internal electrode was disposed such that it was provided at the center in the thickness direction. After sintering the obtained laminated product at 925° C. for 2 hours, the sintered body was processed to a size of 5.0 mm in width, 1.5 mm in height (dimension in laminated direction) and 9.5 mm in length (dimension in extending direction of internal electrode), and an external electrode was formed to produce a tri-plate type resonator, as shown in FIGS. 1 and 2 The obtained tri-plate type resonator was evaluated on the unloaded Q-value at a resonance frequency of 2.5 GHz. The result thereof is shown in Table 2.

Examples 2 to 10

In the same manner as in Example 1, $ZnAl_2O_4$ and $Zn_2SiO_4$ powders, $TiO_2$ powder, and glass powder were weighed to have the composition ratios shown in Table 1, respectively. The weighed powders were then mixed and molded under the same condition as Example 1. The pellets obtained were sintered in air atmosphere at from 900 to 925° C. for 2 hours as shown in Table 2, whereby dielectric ceramics and resonators were obtained. The obtained dielectric ceramics and resonators were evaluated on various properties in the same method as in Example 1. The results thereof are shown in Table 2. Note that FIG. 3 shows the X-ray diffraction pattern of the dielectric ceramics obtained in Example 2.

Comparative Examples 1 to 8

In the same manner as in Example 1, $ZnAl_2O_4$ and $Zn_2SiO_4$ powders, $TiO_2$ powder, and glass powder were weighed to have the composition ratios shown in Table 1, respectively. The weighed powders were then mixed and molded under the same condition as Example 1. The pellets obtained were sintered in air atmosphere at from 905 to 1000° C. for 2 hours as shown in Table 2, whereby dielectric ceramics and resonators were obtained (preferable sintered bodies were not obtained in some comparative examples). The obtained dielectric ceramics and resonators were evaluated on various properties in the same method as in Example 1. The results thereof are shown in Table 2.

Example 11

Respective powders of ZnO and $TiO_2$ were weighed so that the molar ratio between them became 2:1. The weighed powders were charged into a ball mill together with ethanol and $ZrO_2$ ball and wet-mixed for 24 hours. After removing the solvent from the solution, the resulting mixture was dried and calcined in air atmosphere at 1000° C. for 2 hours to obtain a powder of $Zn_2TiO_4$ crystal.

Further, in the same manner as in Example 1, $ZnAl_2O_4$ and $Zn_2SiO_4$ powders were obtained.

The $ZnAl_2O_4$ powder, $Zn_2SiO_4$ powder, and $Zn_2TiO_4$ powder thus obtained and $TiO_2$ powder and glass powder were weighed to have the composition ratio shown in Table 1, respectively. The weighed powders were then mixed and molded under the same condition as Example 1. The pellet obtained was sintered in air atmosphere at 875° C. for 2 hours, whereby dielectric ceramics and resonators were obtained. The obtained dielectric ceramics and resonators were evaluated on various properties in the same method as in Example 1. The results thereof are shown in Table 2.

Examples 12 to 22

In the same manner as in Example 11, $ZnAl_2O_4$, $Zn_2SiO_4$, and $Zn_2TiO_4$ powders, $TiO_2$ powder, and glass powder were weighed to have the composition ratios shown in Table 1, respectively. The weighed powders were then mixed and molded under the same condition as Example 1. The pellets obtained were sintered in air atmosphere at from 825 to 905° C. for 2 hours as shown in Table 2, whereby dielectric ceramics and resonators were obtained. The obtained dielectric ceramics and resonators were evaluated on various properties in the same method as in Example 1. The results thereof are shown in Table 2. Note that FIG. 4 shows the X-ray diffraction pattern of the dielectric ceramics obtained in Example 13.

Comparative Examples 9 to 18

In the same manner as in Example 11, $ZnAl_2O_4$, $Zn_2SiO_4$, and $Zn_2TiO_4$ powders, $TiO_2$ powder, and glass powder were weighed to have the composition ratios shown in Table 1, respectively. The weighed powders were then mixed and molded under the same condition as Example 1. The pellets obtained were sintered in air atmosphere at from 850 to 1000° C. for 2 hours as shown in Table 2, whereby dielectric ceramics and resonators were obtained (preferable sintered bodies were not obtained in some comparative examples). The obtained dielectric ceramics and resonators were evaluated on various properties in the same method as in Example 1. The results thereof are shown in Table 2.

(2) EXAMPLES AND COMPARATIVE EXAMPLES RELATED TO THE SECOND EMBODIMENT

Example 23

Predetermined amounts (200 g, in total) of ZnO, $Al_2O_3$, $SiO_2$, and $TiO_2$ were weighed in an amount of 10.0 mol %, 35.0 mol %, 35.0 mol %, and 20.0 mol %, respectively. The weighed material powders were charged into a ball mill together with ethanol and $ZrO_2$ ball and wet-mixed for 24 hours. After removing the solvent from the solution, the resulting mixed powder was pulverized. Then, the pulverized product was calcined at 1000° C. in air atmosphere. The obtained calcined powder was pulverized to obtain the main component.

Powders of the main component and a glass powder were weighed in predetermined amounts (150 g, in total) so that $Li_2O$ powder and the glass powder containing $SiO_2$ in an amount of 6.0 wt %, $Al_2O_3$ in an amount of 12.0 wt %, ZnO in an amount of 47.0 wt %, BaO in an amount of 3.0 wt %, SrO in an amount of 1.0 wt %, $SnO_2$ in an amount of 1.0 wt %, and $B_2O_3$ in an amount of 30.0 wt % became 5 parts by weight and 20 parts by weight, respectively, based on 100 parts by weight of the main component. The weighed powders were charged into a ball mill together with ethanol and $ZrO_2$ ball and wet-mixed for 24 hours. After removing the solvent from the solution, the resulting mixture was dried.

The obtained mixed powder was pulverized. Then, to the pulverized product, an appropriate amount of a polyvinyl alcohol solution was added, followed by drying. Thereafter, the resulting pulverized product was molded into a pellet having a diameter of 10 mm and a thickness of 5 mm and the pellet obtained was sintered in air atmosphere at 925° C. for 2 hours, whereby the dielectric ceramics was obtained.

The thus-obtained dielectric ceramics was processed to a size of 8 mm in diameter and 4 mm in thickness and then measured by a dielectric resonance method to calculate the $Q \times f_0$ value at the resonance frequency of 9 to 13 GHz, the dielectric constant $\epsilon_r$, and the temperature coefficient $\tau_f$ of resonance frequency. The results thereof are shown in Table 4.

Also, to 100 g of the dry-mixed powder obtained by mixing the main component, $Li_2O$ powder, and the glass powder followed by solvent removal, 9 g of polyvinyl butyral as a binder, 6 g of dibutylphthalate as a plasticizer, and 60 g of toluene and 30 g of isopropyl alcohol both as a solvent were added to produce a green sheet having a thickness of 100 μm by the doctor blade method. Then, 20 layers of the green sheets were laminated by the thermo compression bonding of applying a pressure of 200 kg/cm² at a temperature of 65° C. At this time, a layer having been printed with Ag pattern as an internal electrode was disposed such that it was provided at the center in the thickness direction. After sintering the obtained laminated product at 975° C. for 2 hours, the sintered body was processed to a size of 5.0 mm in width, 1.5 mm in height and 9.5 mm in length, and an external electrode was formed to produce a tri-plate type resonator, as shown in FIGS. 1 and 2. The obtained tri-plate type resonator was evaluated on the unloaded Q-value at a resonance frequency of 2.5 GHz. The result thereof is shown in Table 4.

Examples 24 to 42

In the same manner as in Example 23, the calcined powder of the main component, $Li_2O$ powder, and glass powder were weighed to have the composition ratios shown in Table 3, respectively. The weighed powders were then mixed and molded under the same condition as Example 23. The pellets obtained were sintered in air atmosphere at from 850 to 975° C. for 2 hours as shown in Table 3, whereby dielectric ceramics and resonators were obtained. The obtained dielectric ceramics and resonators were evaluated on various properties in the same method as in Example 23. The results thereof are shown in Table 4. Note that FIG. 5 shows the X-ray diffraction pattern of the dielectric ceramics obtained in Example 33.

Comparative Examples 19 to 29

In the same manner as in Example 23, the calcined powder of the main component, $Li_2O$ powder, and glass powder were weighed to have the composition ratios shown in Table 3, respectively. The weighed powders were then mixed and molded under the same condition as Example 23. The pellets obtained were sintered in air atmosphere at from 875 to 1000° C. for 2 hours as shown in Table 4, whereby dielectric ceramics and resonators were obtained (preferable sintered bodies were not obtained in some comparative examples). The obtained dielectric ceramics and resonators were evaluated on various properties in the same method as in Example 23. The results thereof are shown in Table 4.

(3) EXAMPLES AND COMPARATIVE EXAMPLES RELATED TO THE THIRD EMBODIMENT

Example 43

In order to obtain a main component containing $ZnAl_2O_4$ in an amount of 75.0 mol %, $Zn_2SiO_4$ in an amount of 5.0 mol %, $SiO_2$ in an amount of 5.0 mol %, and $SrTiO_3$ in an amount of 15.0 mol %, predetermined amounts (200 g, in total) of the respective powders including zinc oxide (ZnO), aluminium oxide ($Al_2O_3$), silicon oxide ($SiO_2$), strontium oxide (SrO), and titanium oxide ($TiO_2$) were weighed. The weighed powders were charged into a ball mill together with ethanol and $ZrO_2$ ball and wet-mixed for 24 hours. After removing the solvent from the solution, the resulting mixed powder was pulverized. Then, the pulverized product was calcined at 1000° C. in air atmosphere. The obtained calcined powder was pulverized to obtain the main component.

Powder of the main component, $Li_2O$ powder and a glass powder were weighed in predetermined amounts (150 g, in total) so that $Li_2O$ powder and the glass powder containing $SiO_2$ in an amount of 6.0 wt %, $Al_2O_3$ in an amount of 12.0 wt %, ZnO in an amount of 47.0 wt %, BaO in an amount of 3.0 wt %, SrO in an amount of 1.0 wt %, $SnO_2$ in an amount of 1.0 wt %, and $B_2O_3$ in an amount of 30.0 wt % became 5 parts by weight and 25 parts by weight, respectively, based on 100 parts by weight of the main component. The weighed powders were charged into a ball mill together with ethanol and $ZrO_2$ ball and wet-mixed for 24 hours. After removing the solvent from the solution, the resulting mixture was dried.

The obtained mixed powder was pulverized. Then, to the pulverized product, an appropriate amount of a polyvinyl alcohol solution was added, followed by drying. Thereafter, the resulting pulverized product was molded into a pellet having a diameter of 10 mm and a thickness of 5 mm and the pellet obtained was sintered in air atmosphere at 975° C. for 2 hours, whereby the dielectric ceramics was obtained.

The thus-obtained dielectric ceramics was processed to a size of 8 mm in diameter and 4 mm in thickness and then measured by a dielectric resonance method to calculate the $Q \times f_0$ value at the resonance frequency of 9 to 13 GHz, the dielectric constant $\epsilon_r$, and the temperature coefficient $\tau_f$ of resonance frequency. The results thereof are shown in Table 6.

Also, to 100 g of the dry-mixed powder obtained by mixing the main component, $Li_2O$ powder, and the glass powder followed by solvent removal, 9 g of polyvinyl butyral as a binder, 6 g of dibutylphthalate as a plasticizer, and 60 g of toluene and 30 g of isopropyl alcohol both as a solvent were added to produce a green sheet having a thickness of 100 μm by the doctor blade method. Then, 20 layers of the green sheets were laminated by the thermo compression bonding of applying a pressure of 200 kg/cm² at a temperature of 65° C. At this time, a layer having been printed with Ag pattern as an internal electrode was disposed such that it was provided at the center in the thickness direction. After sintering the obtained laminated product at 975° C. for 2 hours, the sintered body was processed to a size of 5.0 mm in width, 1.5 mm in height and 9.5 mm in length, and an external electrode was formed to produce a tri-plate type resonator, as shown in FIGS. 1 and 2. The obtained tri-plate type resonator was evaluated on the unloaded Q-value at a resonance frequency of 2.5 GHz. The result thereof is shown in Table 6.

Examples 44 to 62

In the same manner as in Example 43, the calcined powder of the main component, $Li_2O$ powder, and glass powder were weighed to have the composition ratios shown in Table 5, respectively. The weighed powders were then mixed and molded under the same condition as Example 43. The pellets obtained were sintered in air atmosphere at from 825 to 975° C. for 2 hours as shown in Table 6, whereby dielectric ceramics and resonators were obtained. The obtained dielectric ceramics and resonators were evaluated on various properties in the same method as in Example 43. The results thereof are shown in Table 6. FIG. 6 shows the X-ray diffraction pattern of the dielectric ceramics of Example 44, which is obtained by sintering the dielectric ceramic composition obtained by mixing the main component represented by $aZnAl_2O_4$-$bZn_2SiO_4$-$cSiO_2$-$dSrTiO_3$ according to the present invention, $Li_2O$ as a subcomponent, and glass component.

Comparative Examples 30 to 41

In the same manner as in Example 43, the calcined powder of the main component, $Li_2O$ powder, and glass powder were weighed to have the composition ratios shown in Table 5, respectively. The weighed powders were then mixed and molded under the same condition as Example 43. The pellets obtained were sintered in air atmosphere at from 825 to 1000° C. for 2 hours as shown in Table 6, whereby dielectric ceramics and resonators were obtained (preferable sintered bodies were not obtained in some comparative examples). The obtained dielectric ceramics and resonators were evaluated on various properties in the same method as in Example 43. The results thereof are shown in Table 6.

(4) EXAMPLES AND COMPARATIVE EXAMPLES RELATED TO THE FOURTH EMBODIMENT

Example 63

MgO and $SiO_2$ were weighed so that the molar ratio between them became 2:1. The weighed powders were charged into a ball mill together with ethanol and $ZrO_2$ ball and wet-mixed for 24 hours. After removing the solvent from the solution, the resulting mixture was dried and calcined at 1200° C. for 2 hours. The obtained calcined body was pulverized to obtain a powder of $Mg_2SiO_4$. Further, ZnO and $Al_2O_3$ were weighed so that the molar ratio between them became 1:1. The weighed powders were charged into a ball mill together with ethanol and $ZrO_2$ ball and wet-mixed for 24 hours. After removing the solvent from the solution, the resulting mixture was dried and calcined at 1100° C. for 2 hours. The obtained calcined body was pulverized to obtain a powder of $ZnAl_2O_4$. Further, CaO and $TiO_2$ were weighed so that the molar ratio between them became 1:1. The weighed powders were charged into a ball mill together with ethanol and $ZrO_2$ ball and wet-mixed for 24 hours. After removing the solvent from the solution, the resulting mixture was dried and calcined at 1250° C. for 2 hours. The obtained calcined body was pulverized to obtain a powder of $CaTiO_3$.

Then, $Mg_2SiO_4$, $ZnAl_2O_4$, $SiO_2$, and $CaTiO_3$ were weighed in molar fractions of 0.12, 0.58, 0.10, and 0.20, respectively and mixed to obtain the main component. Further, 100 parts by weight of the main component, 5 parts by weight of $Li_2O$ powder, and 25 parts by weight of glass powder containing $SiO_2$ in an amount of 6.0 wt %, $Al_2O_3$ in an amount of 12.0 wt %, ZnO in an amount of 25.0 wt %, BaO in an amount of 25.0 wt %, SrO in an amount of 1.0 wt %, $SnO_2$ in an amount of 1.0 wt %, and $B_2O_3$ in an amount of 30.0 wt % were weighed in predetermined amounts (150 g, in total). The weighed powders were charged into a ball mill together with ethanol and $ZrO_2$ ball and wet-mixed for 24 hours. After removing the solvent from the solution, the resulting mixture was dried.

The obtained mixed powder was pulverized. Then, to the pulverized product, an appropriate amount of a polyvinyl alcohol solution was added, followed by drying. Thereafter, the resulting pulverized product was molded into a pellet having a diameter of 10 mm and a thickness of 5 mm and the pellet obtained was sintered in air atmosphere at 925° C. for 2 hours, whereby the dielectric ceramics were obtained.

The thus-obtained dielectric ceramics were processed to a size of 8 mm in diameter and 4 mm in thickness and then measured by a dielectric resonance method to calculate the $Q \times f^0$ value at the resonance frequency of 9 to 13 GHz, the dielectric constant $\epsilon_r$, and the temperature coefficient $\tau_f$ of resonance frequency. The results thereof are shown in Table 8.

Also, to 100 g of the dry-mixed powder obtained by mixing the main component, $Li_2O$ powder, and the glass powder followed by solvent removal, 9 g of polyvinyl butyral as a binder, 6 g of dibutylphthalate as a plasticizer, and 60 g of toluene and 30 g of isopropyl alcohol both as a solvent were added to produce a green sheet having a thickness of 100 μm by the doctor blade method. Then, 20 layers of the green sheets were laminated by the thermo compression bonding of applying a pressure of 200 kg/cm² at a temperature of 65° C. At this time, a layer having been printed with Ag pattern as an internal electrode was disposed such that it was provided at the center in the thickness direction. After sintering the obtained laminated product at 925° C. for 2 hours, the sintered body was processed to a size of 5.0 mm in width, 1.5 mm in height and 9.5 mm in length, and an external electrode was formed to produce a tri-plate type resonator, as shown in FIGS. 1 and 2. The obtained tri-plate type resonator was evaluated on the unloaded Q-value at a resonance frequency of 2.5 GHz. The result thereof is shown in Table 8.

Examples 64 to 75

In the same manner as in Example 63, the powder of the main component, $Li_2O$ powder, and glass powder were weighed to have the composition ratios shown in Table 7, respectively. The weighed powders were then mixed and molded under the same condition as Example 63. The pellets obtained were sintered in air atmosphere at from 850 to 925° C. for 2 hours as shown in Table 7, whereby dielectric ceramics and resonators were obtained. The obtained dielectric ceramics and resonators were evaluated on various properties in the same method as in Example 63. The results thereof are shown in Table 8. FIG. 7 shows the X-ray diffraction pattern of the dielectric ceramics of Example 68, which is obtained by sintering the dielectric ceramic composition obtained by mixing the four-phase main component represented by $aMg_2SiO_4$-$bZnAl_2O_4$-$cSiO_2$-$dCaTiO_3$ according to the present invention, $Li_2O$ as a subcomponent, and glass component.

Examples 76 to 84

ZnO and $SiO_2$ were weighed so that the molar ratio between them became 2:1. The weighed powders were charged into a ball mill together with ethanol and $ZrO_2$ ball and wet-mixed for 24 hours. After removing the solvent from the solution, the resulting mixture was dried and calcined at 1100° C. for 2 hours. The obtained calcined body is then pulverized to obtain a powder of $Zn_2SiO_4$ serving as the material of the main component. After that, in the same manner as in Example 63, the powder of the main component, $Li_2O$ powder, and glass powder were weighed to have the composition ratios shown in Table 7, respectively. The weighed powders were then mixed and molded under the same condition as Example 63. The pellets obtained were sintered in air atmosphere at from 800 to 900° C. for 2 hours as shown in Table 8, whereby dielectric ceramics and resonators were obtained. The obtained dielectric ceramics and resonators were evaluated on various properties in the same method as in Example 63. The results thereof are shown in Table 8. FIG. 8 shows the X-ray diffraction pattern of the dielectric ceramics of Example 76, which is obtained by sintering the dielectric ceramic composition obtained by mixing the five-phase main component represented by $aMg_2SiO_4$-$bZnAl_2O_4$-$cSiO_2$-$dCaTiO_3$-$eZn_2SiO_4$ according to the present invention, $Li_2O$ as a subcomponent, and glass component.

Comparative Examples 42 to 49

In the same manner as in Example 63, the calcined powder of the main component, $Li_2O$ powder, and glass powder were weighed to have the composition ratios shown in Table 7, respectively. The weighed powders were then mixed and molded under the same condition as Example 63. The pellets obtained were sintered in air atmosphere at from 850 to 1000° C. for 2 hours as shown in Table 8, whereby dielectric ceramics and resonators were obtained (preferable sintered bodies were not obtained in some comparative examples). The obtained dielectric ceramics and resonators were evaluated on various properties in the same method as in Example 63. The results thereof are shown in Table 8.

Comparative Examples 50 to 54

In the same manner as in Example 76, the calcined powder of the main component, $Li_2O$ powder, and glass powder were weighed to have the composition ratios shown in Table 7, respectively. The weighed powders were then mixed and molded under the same condition as Example 63. The pellets obtained were sintered in air atmosphere at from 825 to 1000° C. for 2 hours as shown in Table 8, whereby dielectric ceramics and resonators were obtained (preferable sintered bodies were not obtained in some comparative examples). The obtained dielectric ceramics and resonators were evaluated on various properties in the same method as in Example 63. The results thereof are shown in Table 8.

TABLE 1

| | Main component composition(mol %) | | | | Glass component composition(wt %) | | | | | |
|---|---|---|---|---|---|---|---|---|---|---|
| | ZnAl2O4 | Zn2SiO4 | TiO2 | Zn2TiO4 | | | | | | |
| | a | b | c | d | SiO2 | Al2O3 | ZnO | PbO | Bi2O3 | BaO |
| Example 1 | 7.50 | 67.50 | 25.00 | 0.00 | 6.0 | 11.0 | 47.0 | — | — | 4.0 |
| Example 2 | 45.00 | 45.00 | 10.00 | 0.00 | 6.0 | 11.0 | 47.0 | — | — | 4.0 |
| Example 3 | 45.00 | 45.00 | 10.00 | 0.00 | 26.0 | 1.0 | 12.0 | 30.0 | 1.0 | — |
| Example 4 | 45.00 | 45.00 | 10.00 | 0.00 | 65.0 | 3.0 | — | — | — | 0.1 |
| Example 5 | 60.00 | 32.50 | 7.50 | 0.00 | 6.0 | 11.0 | 47.0 | — | — | 4.0 |
| Example 6 | 77.50 | 7.50 | 15.00 | 0.00 | 6.0 | 11.0 | 47.0 | — | — | 4.0 |
| Example 7 | 80.00 | 10.00 | 10.00 | 0.00 | 6.0 | 11.0 | 47.0 | — | — | 4.0 |
| Example 8 | 45.00 | 45.00 | 10.00 | 0.00 | 6.0 | 11.0 | 47.0 | — | — | 4.0 |
| Example 9 | 45.00 | 45.00 | 10.00 | 0.00 | 6.0 | 11.0 | 47.0 | — | — | 4.0 |
| Example 10 | 45.00 | 45.00 | 10.00 | 0.00 | 6.0 | 11.0 | 47.0 | — | — | 4.0 |
| Example 11 | 7.50 | 52.50 | 20.00 | 20.00 | 6.0 | 11.0 | 47.0 | — | — | 4.0 |
| Example 12 | 10.00 | 67.50 | 15.00 | 7.50 | 6.0 | 11.0 | 47.0 | — | — | 4.0 |
| Example 13 | 30.00 | 30.00 | 15.00 | 25.00 | 6.0 | 11.0 | 47.0 | — | — | 4.0 |
| Example 14 | 30.00 | 40.00 | 25.00 | 5.00 | 6.0 | 11.0 | 47.0 | — | — | 4.0 |
| Example 15 | 44.00 | 40.00 | 15.00 | 1.00 | 6.0 | 11.0 | 47.0 | — | — | 4.0 |
| Example 16 | 44.00 | 40.00 | 15.00 | 1.00 | 26.0 | 1.0 | 12.0 | 30.0 | 1.0 | — |
| Example 17 | 44.00 | 40.00 | 15.00 | 1.00 | 65.0 | 3.0 | — | — | — | 0.1 |
| Example 18 | 77.50 | 7.50 | 7.50 | 7.50 | 6.0 | 11.0 | 47.0 | — | — | 4.0 |
| Example 19 | 80.00 | 9.00 | 10.90 | 0.10 | 6.0 | 11.0 | 47.0 | — | — | 4.0 |
| Example 20 | 44.00 | 40.00 | 15.00 | 1.00 | 6.0 | 11.0 | 47.0 | — | — | 4.0 |
| Example 21 | 44.00 | 40.00 | 15.00 | 1.00 | 6.0 | 11.0 | 47.0 | — | — | 4.0 |
| Example 22 | 44.00 | 40.00 | 15.00 | 1.00 | 6.0 | 11.0 | 47.0 | — | — | 4.0 |
| Comparative Example 1 | 2.50 | 70.00 | 27.50 | 0.00 | 6.0 | 11.0 | 47.0 | — | — | 4.0 |
| Comparative Example 2 | 17.50 | 75.00 | 7.50 | 0.00 | 6.0 | 11.0 | 47.0 | — | — | 4.0 |
| Comparative Example 3 | 50.00 | 47.50 | 2.50 | 0.00 | 6.0 | 11.0 | 47.0 | — | — | 4.0 |
| Comparative Example 4 | 50.00 | 47.50 | 2.50 | 0.00 | 26.0 | 1.0 | 12.0 | 30.0 | 1.0 | — |
| Comparative Example 5 | 50.00 | 47.50 | 2.50 | 0.00 | 65.0 | 3.0 | — | — | — | 0.1 |
| Comparative Example 6 | 65.00 | 5.00 | 30.00 | 0.00 | 6.0 | 11.0 | 47.0 | — | — | 4.0 |
| Comparative Example 7 | 77.50 | 2.50 | 20.00 | 0.00 | 6.0 | 11.0 | 47.0 | — | — | 4.0 |
| Comparative Example 8 | 87.50 | 5.00 | 7.50 | 0.00 | 6.0 | 11.0 | 47.0 | — | — | 4.0 |
| Comparative Example 9 | 2.50 | 60.00 | 25.00 | 12.50 | 6.0 | 11.0 | 47.0 | — | — | 4.0 |
| Comparative Example 10 | 15.00 | 75.00 | 5.00 | 5.00 | 6.0 | 11.0 | 47.0 | — | — | 4.0 |
| Comparative Example 11 | 25.00 | 42.50 | 30.00 | 2.50 | 6.0 | 11.0 | 47.0 | — | — | 4.0 |

TABLE 1-continued

| | | | | | | | | | | |
|---|---|---|---|---|---|---|---|---|---|---|
| Comparative Example 12 | 32.50 | 20.00 | 15.00 | 32.50 | 6.0 | 11.0 | 47.0 | — | — | 4.0 |
| Comparative Example 13 | 40.00 | 20.00 | 30.00 | 10.00 | 6.0 | 11.0 | 47.0 | — | — | 4.0 |
| Comparative Example 14 | 50.00 | 35.00 | 2.50 | 12.50 | 6.0 | 11.0 | 47.0 | — | — | 4.0 |
| Comparative Example 15 | 70.00 | 2.50 | 15.00 | 12.50 | 6.0 | 11.0 | 47.0 | — | — | 4.0 |
| Comparative Example 16 | 87.50 | 5.00 | 7.00 | 0.50 | 6.0 | 11.0 | 47.0 | — | — | 4.0 |
| Comparative Example 17 | 44.00 | 40.00 | 15.00 | 1.00 | 6.0 | 11.0 | 47.0 | — | — | 4.0 |
| Comparative Example 18 | 44.00 | 40.00 | 15.00 | 1.00 | 6.0 | 11.0 | 47.0 | — | — | 4.0 |

| | Glass component composition(wt %) | | | | | mixing ratio between main component and glass component | |
|---|---|---|---|---|---|---|---|
| | SrO | CaO | $SnO_2$ | $ZrO_2$ | $B_2O_3$ | Main component (part by weight) | Glass component (part by weight) |
| Example 1 | 0.2 | 0.8 | 1.0 | — | 30.0 | 100 | 30 |
| Example 2 | 0.2 | 0.8 | 1.0 | — | 30.0 | 100 | 30 |
| Example 3 | — | — | — | — | 30.0 | 100 | 30 |
| Example 4 | — | 0.5 | — | 2.5 | 30.0 | 100 | 30 |
| Example 5 | 0.2 | 0.8 | 1.0 | — | 30.0 | 100 | 30 |
| Example 6 | 0.2 | 0.8 | 1.0 | — | 30.0 | 100 | 30 |
| Example 7 | 0.2 | 0.8 | 1.0 | — | 30.0 | 100 | 30 |
| Example 8 | 0.2 | 0.8 | 1.0 | — | 30.0 | 100 | 10 |
| Example 9 | 0.2 | 0.8 | 1.0 | — | 30.0 | 100 | 70 |
| Example 10 | 0.2 | 0.8 | 1.0 | — | 30.0 | 100 | 130 |
| Example 11 | 0.2 | 0.8 | 1.0 | — | 30.0 | 100 | 30 |
| Example 12 | 0.2 | 0.8 | 1.0 | — | 30.0 | 100 | 30 |
| Example 13 | 0.2 | 0.8 | 1.0 | — | 30.0 | 100 | 30 |
| Example 14 | 0.2 | 0.8 | 1.0 | — | 30.0 | 100 | 30 |
| Example 15 | 0.2 | 0.8 | 1.0 | — | 30.0 | 100 | 30 |
| Example 16 | — | — | — | — | 30.0 | 100 | 30 |
| Example 17 | — | 0.5 | — | 2.5 | 30.0 | 100 | 30 |
| Example 18 | 0.2 | 0.8 | 1.0 | — | 30.0 | 100 | 30 |
| Example 19 | 0.2 | 0.8 | 1.0 | — | 30.0 | 100 | 30 |
| Example 20 | 0.2 | 0.8 | 1.0 | — | 30.0 | 100 | 10 |
| Example 21 | 0.2 | 0.8 | 1.0 | — | 30.0 | 100 | 70 |
| Example 22 | 0.2 | 0.8 | 1.0 | — | 30.0 | 100 | 130 |
| Comparative Example 1 | 0.2 | 0.8 | 1.0 | — | 30.0 | 100 | 30 |
| Comparative Example 2 | 0.2 | 0.8 | 1.0 | — | 30.0 | 100 | 30 |
| Comparative Example 3 | 0.2 | 0.8 | 1.0 | — | 30.0 | 100 | 30 |
| Comparative Example 4 | — | — | — | — | 30.0 | 100 | 30 |
| Comparative Example 5 | — | 0.5 | — | 2.5 | 30.0 | 100 | 30 |
| Comparative Example 6 | 0.2 | 0.8 | 1.0 | — | 30.0 | 100 | 30 |
| Comparative Example 7 | 0.2 | 0.8 | 1.0 | — | 30.0 | 100 | 30 |
| Comparative Example 8 | 0.2 | 0.8 | 1.0 | — | 30.0 | 100 | 30 |
| Comparative Example 9 | 0.2 | 0.8 | 1.0 | — | 30.0 | 100 | 30 |
| Comparative Example 10 | 0.2 | 0.8 | 1.0 | — | 30.0 | 100 | 30 |
| Comparative Example 11 | 0.2 | 0.8 | 1.0 | — | 30.0 | 100 | 30 |
| Comparative Example 12 | 0.2 | 0.8 | 1.0 | — | 30.0 | 100 | 30 |
| Comparative Example 13 | 0.2 | 0.8 | 1.0 | — | 30.0 | 100 | 30 |
| Comparative Example 14 | 0.2 | 0.8 | 1.0 | — | 30.0 | 100 | 30 |
| Comparative Example 15 | 0.2 | 0.8 | 1.0 | — | 30.0 | 100 | 30 |

TABLE 1-continued

|  | | | | | | | |
|---|---|---|---|---|---|---|---|
| Comparative Example 16 | 0.2 | 0.8 | 1.0 | — | 30.0 | 100 | 30 |
| Comparative Example 17 | 0.2 | 0.8 | 1.0 | — | 30.0 | 100 | 3 |
| Comparative Example 18 | 0.2 | 0.8 | 1.0 | — | 30.0 | 100 | 160 |

TABLE 2

| | Sintering temperature (° C.) | Dielectric resonator charactristics | | | Tri-plate Resonator Unloaded Q |
|---|---|---|---|---|---|
| | | εr (—) | Qxf0 (GHz) | τf (ppm/° C.) | |
| Example 1 | 925 | 10.0 | 19620 | 18.1 | 185 |
| Example 2 | 915 | 9.2 | 23190 | −11.8 | 190 |
| Example 3 | 905 | 9.7 | 16550 | −14.1 | 195 |
| Example 4 | 910 | 8.9 | 18960 | −12.9 | 190 |
| Example 5 | 915 | 9.0 | 23060 | −15.4 | 195 |
| Example 6 | 925 | 9.9 | 25650 | −2.7 | 185 |
| Example 7 | 925 | 9.4 | 25530 | −11.1 | 185 |
| Example 8 | 925 | 9.4 | 35440 | −8.4 | 185 |
| Example 9 | 905 | 8.9 | 16030 | −15.5 | 195 |
| Example 10 | 900 | 8.7 | 12700 | −18.9 | 200 |
| Example 11 | 875 | 10.0 | 11930 | 4.7 | 200 |
| Example 12 | 875 | 9.5 | 15800 | −3.2 | 200 |
| Example 13 | 850 | 10.0 | 11300 | −3.4 | 200 |
| Example 14 | 850 | 10.0 | 17750 | 17.7 | 200 |
| Example 15 | 865 | 9.5 | 21110 | −1.0 | 205 |
| Example 16 | 850 | 10.0 | 15460 | −3.3 | 200 |
| Example 17 | 875 | 9.2 | 17550 | −2.1 | 200 |
| Example 18 | 900 | 9.8 | 15050 | −10.4 | 200 |
| Example 19 | 900 | 9.8 | 22470 | 7.6 | 205 |
| Example 20 | 905 | 9.7 | 30060 | 4.3 | 200 |
| Example 21 | 850 | 8.7 | 15240 | −7.8 | 200 |
| Example 22 | 825 | 8.2 | 12330 | −16.4 | 200 |
| Comparative Example 1 | 925 | 10.2 | 5900 | 17.9 | 160 |
| Comparative Example 2 | 915 | 8.0 | 19230 | −34.0 | 195 |
| Comparative Example 3 | 915 | 8.5 | 21950 | −27.0 | 195 |
| Comparative Example 4 | 905 | 9.0 | 15910 | −29.5 | 195 |
| Comparative Example 5 | 915 | 8.2 | 18130 | −28.3 | 195 |
| Comparative Example 6 | 925 | 11.7 | 25680 | 28.2 | 185 |
| Comparative Example 7 | Not sintered at 1000° C. or less | | | | |
| Comparative Example 8 | Not sintered at 1000° C. or less | | | | |
| Comparative Example 9 | 875 | 10.7 | 4230 | 14.4 | 155 |
| Comparative Example 10 | 875 | 8.0 | 18200 | −39.0 | 205 |
| Comparative Example 11 | 850 | 11.0 | 18990 | 28.3 | 205 |
| Comparative Example 12 | 850 | 11.2 | 3200 | −4.4 | 150 |
| Comparative Example 13 | 875 | 11.9 | 15620 | 29.4 | 200 |
| Comparative Example 14 | 895 | 9.1 | 15370 | −25.0 | 200 |
| Comparative Example 15 | Not sintered at 1000° C. or less | | | | |
| Comparative Example 16 | Not sintered at 1000° C. or less | | | | |
| Comparative Example 17 | Not sintered at 1000° C. or less | | | | |
| Comparative Example 18 | Glass was eluted | | | | |

TABLE 3

| | Main component composition (mol %) | | | | | | Subcomponent Li2O (part by weight) | Glass component composition (wt %) | |
|---|---|---|---|---|---|---|---|---|---|
| | a ZnO | b Al2O3 | c SiO2 | d CaO + TiO2 | x CaO/(CaO + TiO2) | 1 − x TiO2/(CaO + TiO2) | | SiO2 | Al2O3 |
| | a | b | c | d | e | e | | | |
| Example 23 | 10.0 | 35.0 | 35.0 | 20.0 | 0.0 | 1.0 | 5 | 6.0 | 12.0 |
| Example 24 | 30.0 | 25.0 | 25.0 | 20.0 | 0.0 | 1.0 | 5 | 6.0 | 12.0 |
| Example 25 | 40.0 | 25.0 | 25.0 | 10.0 | 0.0 | 1.0 | 5 | 6.0 | 12.0 |
| Example 26 | 40.0 | 25.0 | 25.0 | 10.0 | 0.3 | 0.8 | 5 | 6.0 | 12.0 |
| Example 27 | 40.0 | 25.0 | 25.0 | 10.0 | 0.7 | 0.3 | 5 | 6.0 | 12.0 |
| Example 28 | 10.0 | 10.0 | 65.0 | 15.0 | 0.5 | 0.5 | 5 | 6.0 | 12.0 |
| Example 29 | 10.0 | 35.0 | 35.0 | 20.0 | 0.5 | 0.5 | 5 | 6.0 | 12.0 |
| Example 30 | 10.0 | 60.0 | 10.0 | 20.0 | 0.5 | 0.5 | 5 | 6.0 | 12.0 |
| Example 31 | 25.0 | 25.0 | 25.0 | 25.0 | 0.5 | 0.5 | 5 | 6.0 | 12.0 |
| Example 32 | 50.0 | 15.0 | 15.0 | 20.0 | 0.5 | 0.5 | 5 | 6.0 | 12.0 |
| Example 33 | 40.0 | 20.0 | 20.0 | 20.0 | 0.5 | 0.5 | 5 | 6.0 | 12.0 |
| Example 34 | 40.0 | 20.0 | 20.0 | 20.0 | 0.5 | 0.5 | 10 | 6.0 | 12.0 |
| Example 35 | 40.0 | 20.0 | 20.0 | 20.0 | 0.5 | 0.5 | 25 | 6.0 | 12.0 |
| Example 36 | 30.0 | 25.0 | 25.0 | 20.0 | 0.0 | 1.0 | 5 | 21.0 | 12.0 |
| Example 37 | 30.0 | 25.0 | 25.0 | 20.0 | 0.0 | 1.0 | 5 | 6.0 | 12.0 |
| Example 38 | 40.0 | 20.0 | 20.0 | 20.0 | 0.5 | 0.5 | 10 | 27.0 | — |
| Example 39 | 40.0 | 20.0 | 20.0 | 20.0 | 0.5 | 0.5 | 10 | 67.0 | 2.2 |

TABLE 3-continued

| | | | | | | | | | |
|---|---|---|---|---|---|---|---|---|---|
| Example 40 | 35.0 | 25.0 | 25.0 | 15.0 | 0.5 | 0.5 | 10 | 6.0 | 12.0 |
| Example 41 | 35.0 | 25.0 | 25.0 | 15.0 | 0.5 | 0.5 | 10 | 6.0 | 12.0 |
| Example 42 | 35.0 | 25.0 | 25.0 | 15.0 | 0.5 | 0.5 | 10 | 6.0 | 12.0 |
| Comparative Example 19 | 5.0 | 35.0 | 30.0 | 15.0 | 0.5 | 0.5 | 5 | 6.0 | 12.0 |
| Comparative Example 20 | 60.0 | 15.0 | 15.0 | 10.0 | 0.5 | 0.5 | 5 | 6.0 | 12.0 |
| Comparative Example 21 | 10.0 | 70.0 | 2.5 | 17.5 | 0.5 | 0.5 | 5 | 6.0 | 12.0 |
| Comparative Example 22 | 12.5 | 2.5 | 75.0 | 10.0 | 0.5 | 0.5 | 5 | 6.0 | 12.0 |
| Comparative Example 23 | 40.0 | 25.0 | 25.0 | 10.0 | 0.9 | 1.0 | 5 | 6.0 | 12.0 |
| Comparative Example 24 | 45.0 | 25.0 | 25.0 | 5.0 | 0.5 | 0.5 | 5 | 6.0 | 12.0 |
| Comparative Example 25 | 30.0 | 20.0 | 20.0 | 30.0 | 0.5 | 0.5 | 5 | 6.0 | 12.0 |
| Comparative Example 26 | 30.0 | 25.0 | 25.0 | 20.0 | 0.5 | 0.5 | 0.5 | 6.0 | 12.0 |
| Comparative Example 27 | 30.0 | 25.0 | 25.0 | 20.0 | 0.5 | 0.5 | 35 | 6.0 | 12.0 |
| Comparative Example 28 | 35.0 | 25.0 | 25.0 | 15.0 | 0.7 | 0.3 | 10 | 6.0 | 12.0 |
| Comparative Example 29 | 35.0 | 25.0 | 25.0 | 15.0 | 0.7 | 0.3 | 10 | 6.0 | 12.0 |

| | Glass component composition (wt %) | | | | | | | | Mixing ratio of main component and glass component | |
|---|---|---|---|---|---|---|---|---|---|---|
| | | | | | | | | | Main component (part by weight) | Glass component (part by weight) |
| | ZnO | PbO | Bi2O3 | BaO | SrO | SnO2 | ZrO2 | B2O3 | | |
| Example 23 | 47.0 | — | — | 3.0 | 1.0 | 1.0 | — | 30.0 | 100 | 20 |
| Example 24 | 47.0 | — | — | 3.0 | 1.0 | 1.0 | — | 30.0 | 100 | 20 |
| Example 25 | 47.0 | — | — | 3.0 | 1.0 | 1.0 | — | 30.0 | 100 | 20 |
| Example 26 | 47.0 | — | — | 3.0 | 1.0 | 1.0 | — | 30.0 | 100 | 20 |
| Example 27 | 47.0 | — | — | 3.0 | 1.0 | 1.0 | — | 30.0 | 100 | 20 |
| Example 28 | 47.0 | — | — | 3.0 | 1.0 | 1.0 | — | 30.0 | 100 | 20 |
| Example 29 | 47.0 | — | — | 3.0 | 1.0 | 1.0 | — | 30.0 | 100 | 20 |
| Example 30 | 47.0 | — | — | 3.0 | 1.0 | 1.0 | — | 30.0 | 100 | 20 |
| Example 31 | 47.0 | — | — | 3.0 | 1.0 | 1.0 | — | 30.0 | 100 | 20 |
| Example 32 | 47.0 | — | — | 3.0 | 1.0 | 1.0 | — | 30.0 | 100 | 20 |
| Example 33 | 47.0 | — | — | 3.0 | 1.0 | 1.0 | — | 30.0 | 100 | 20 |
| Example 34 | 47.0 | — | — | 3.0 | 1.0 | 1.0 | — | 30.0 | 100 | 20 |
| Example 35 | 47.0 | — | — | 3.0 | 1.0 | 1.0 | — | 30.0 | 100 | 20 |
| Example 36 | 47.0 | — | — | 3.0 | 1.0 | 1.0 | — | 15.0 | 100 | 20 |
| Example 37 | 32.0 | — | — | 3.0 | 1.0 | 1.0 | — | 45.0 | 100 | 20 |
| Example 38 | 12.0 | 30.0 | 1.0 | — | — | — | — | 30.0 | 100 | 20 |
| Example 39 | — | — | — | 0.1 | — | — | 0.7 | 30.0 | 100 | 20 |
| Example 40 | 47.0 | — | — | 3.0 | 1.0 | 1.0 | — | 30.0 | 100 | 10 |
| Example 41 | 47.0 | — | — | 3.0 | 1.0 | 1.0 | — | 30.0 | 100 | 50 |
| Example 42 | 47.0 | — | — | 3.0 | 1.0 | 1.0 | — | 30.0 | 100 | 130 |
| Comparative Example 19 | 47.0 | — | — | 3.0 | 1.0 | 1.0 | — | 30.0 | 100 | 20 |
| Comparative Example 20 | 47.0 | — | — | 3.0 | 1.0 | 1.0 | — | 30.0 | 100 | 20 |
| Comparative Example 21 | 47.0 | — | — | 3.0 | 1.0 | 1.0 | — | 30.0 | 100 | 20 |
| Comparative Example 22 | 47.0 | — | — | 3.0 | 1.0 | 1.0 | — | 30.0 | 100 | 20 |
| Comparative Example 23 | 47.0 | — | — | 3.0 | 1.0 | 1.0 | — | 30.0 | 100 | 20 |
| Comparative Example 24 | 47.0 | — | — | 3.0 | 1.0 | 1.0 | — | 30.0 | 100 | 40 |
| Comparative Example 25 | 47.0 | — | — | 3.0 | 1.0 | 1.0 | — | 30.0 | 100 | 20 |
| Comparative Example 26 | 47.0 | — | — | 3.0 | 1.0 | 1.0 | — | 30.0 | 100 | 20 |
| Comparative Example 27 | 47.0 | — | — | 3.0 | 1.0 | 1.0 | — | 30.0 | 100 | 20 |
| Comparative Example 28 | 47.0 | — | — | 3.0 | 1.0 | 1.0 | — | 30.0 | 100 | 2.5 |
| Comparative Example 29 | 47.0 | — | — | 3.0 | 1.0 | 1.0 | — | 30.0 | 100 | 160 |

TABLE 4

|  | Sintering temperature (° C.) | Dielectric resonator characteristics | | | Tri-plate resonator Unloaded Q |
|---|---|---|---|---|---|
|  |  | εr (—) | Qxf0 (GHz) | τf (ppm/° C.) |  |
| Example 23 | 975 | 8.8 | 21000 | 10.0 | 235 |
| Example 24 | 975 | 9.8 | 23150 | 5.0 | 240 |
| Example 25 | 975 | 9.1 | 26220 | −18.4 | 250 |
| Example 26 | 925 | 9.3 | 24870 | −10.9 | 245 |
| Example 27 | 875 | 9.7 | 23050 | −8.5 | 240 |
| Example 28 | 875 | 7.5 | 27250 | 7.4 | 255 |
| Example 29 | 900 | 8.2 | 23000 | 13.7 | 240 |
| Example 30 | 900 | 9.6 | 22100 | 0.0 | 240 |
| Example 31 | 875 | 9.8 | 21130 | 18.1 | 235 |
| Example 32 | 900 | 9.6 | 20920 | 0.5 | 235 |
| Example 33 | 875 | 9.5 | 22300 | 1.8 | 240 |
| Example 34 | 875 | 9.1 | 23270 | −1.5 | 240 |
| Example 35 | 875 | 8.7 | 20960 | −16.3 | 235 |
| Example 36 | 975 | 9.5 | 23950 | 3.9 | 245 |
| Example 37 | 950 | 9.8 | 21150 | 4.9 | 235 |
| Example 38 | 900 | 9.7 | 22240 | −2.7 | 240 |
| Example 39 | 900 | 8.5 | 23820 | −3.4 | 245 |
| Example 40 | 925 | 9.7 | 28780 | −1.0 | 260 |
| Example 41 | 875 | 9.2 | 23920 | −7.9 | 245 |
| Example 42 | 850 | 8.8 | 20110 | −16.6 | 230 |
| Comparative Example 19 | Not sintered at 1000° C. or less | | | | |
| Comparative Example 20 | 900 | 9.4 | 4300 | −12.3 | 150 |
| Comparative Example 21 | Not sintered at 1000° C. or less | | | | |
| Comparative Example 22 | 900 | 7.2 | 5200 | −21.0 | 165 |
| Comparative Example 23 | 925 | 12.6 | 8700 | 42.9 | 180 |
| Comparative Example 24 | 900 | 8.6 | 13000 | −34.0 | 180 |
| Comparative Example 25 | 875 | 8.2 | 12500 | −40.0 | 180 |
| Comparative Example 26 | Not sintered at 1000° C. or less | | | | |
| Comparative Example 27 | Glass was eluted | | | | |
| Comparative Example 28 | Not sintered at 1000° C. or less | | | | |
| Comparative Example 29 | Glass was eluted | | | | |

TABLE 5

|  | Main component composition (mol %) | | | | Subcomponent Li2CO3 (part by weight) | Glass component composition(wt %) | | | | |
|---|---|---|---|---|---|---|---|---|---|---|
|  | a ZnAl2O4 a | b Zn2SiO4 b | c SiO2 c | d SrTiO3 d |  | SiO2 | Al2O3 | ZnO | PbO | Bi2O3 |
| Example 43 | 75.0 | 5.0 | 5.0 | 15.0 | 5 | 6.0 | 12.0 | 47.0 | — | — |
| Example 44 | 55.0 | 25.0 | 5.0 | 15.0 | 5 | 6.0 | 12.0 | 47.0 | — | — |
| Example 45 | 40.0 | 40.0 | 5.0 | 15.0 | 5 | 6.0 | 12.0 | 47.0 | — | — |
| Example 46 | 25.0 | 55.0 | 5.0 | 15.0 | 5 | 6.0 | 12.0 | 47.0 | — | — |
| Example 47 | 5.0 | 75.0 | 5.0 | 15.0 | 5 | 6.0 | 12.0 | 47.0 | — | — |
| Example 48 | 35.0 | 35.0 | 10.0 | 15.0 | 5 | 6.0 | 12.0 | 47.0 | — | — |
| Example 49 | 32.5 | 32.5 | 20.0 | 15.0 | 5 | 6.0 | 12.0 | 47.0 | — | — |
| Example 50 | 27.5 | 27.5 | 30.0 | 15.0 | 5 | 6.0 | 12.0 | 47.0 | — | — |
| Example 51 | 25.0 | 25.0 | 35.0 | 15.0 | 5 | 6.0 | 12.0 | 47.0 | — | — |
| Example 52 | 40.0 | 32.5 | 12.5 | 12.5 | 5 | 6.0 | 12.0 | 47.0 | — | — |
| Example 53 | 35.0 | 22.5 | 30.0 | 12.5 | 5 | 6.0 | 12.0 | 47.0 | — | — |
| Example 54 | 40.0 | 30.0 | 15.0 | 15.0 | 10 | 6.0 | 12.0 | 47.0 | — | — |
| Example 55 | 40.0 | 30.0 | 15.0 | 15.0 | 25 | 6.0 | 12.0 | 47.0 | — | — |
| Example 56 | 35.0 | 22.5 | 30.0 | 12.5 | 5 | 21.0 | 12.0 | 47.0 | — | — |
| Example 57 | 35.0 | 22.5 | 30.0 | 12.5 | 5 | 6.0 | 12.0 | 32.0 | — | — |
| Example 58 | 40.0 | 30.0 | 15.0 | 15.0 | 10 | 27.0 | — | 12.0 | 30.0 | 1.0 |
| Example 59 | 40.0 | 30.0 | 15.0 | 15.0 | 10 | 67.0 | 2.2 | — | — | — |
| Example 60 | 40.0 | 32.5 | 12.5 | 12.5 | 10 | 6.0 | 12.0 | 47.0 | — | — |
| Example 61 | 40.0 | 32.5 | 12.5 | 12.5 | 10 | 6.0 | 12.0 | 47.0 | — | — |
| Example 62 | 40.0 | 32.5 | 12.5 | 12.5 | 10 | 6.0 | 12.0 | 47.0 | — | — |

TABLE 5-continued

| | | | | | | | | | | |
|---|---|---|---|---|---|---|---|---|---|---|
| Comparative Example 30 | 80.0 | 2.5 | 5.0 | 12.5 | 5 | 6.0 | 12.0 | 47.0 | — | — |
| Comparative Example 31 | 1.0 | 54.0 | 30.0 | 15.0 | 5 | 6.0 | 12.0 | 47.0 | — | — |
| Comparative Example 32 | 2.5 | 80.0 | 5.0 | 12.5 | 5 | 6.0 | 12.0 | 47.0 | — | — |
| Comparative Example 33 | 54.0 | 1.0 | 30.0 | 15.0 | 5 | 6.0 | 12.0 | 47.0 | — | — |
| Comparative Example 34 | 42.0 | 42.0 | 1.0 | 15.0 | 5 | 6.0 | 12.0 | 47.0 | — | — |
| Comparative Example 35 | 25.0 | 17.5 | 40.0 | 17.5 | 5 | 6.0 | 12.0 | 47.0 | — | — |
| Comparative Example 36 | 35.0 | 27.5 | 30.0 | 7.5 | 5 | 6.0 | 12.0 | 47.0 | — | — |
| Comparative Example 37 | 25.0 | 20.0 | 35.0 | 20.0 | 5 | 6.0 | 12.0 | 47.0 | — | — |
| Comparative Example 38 | 40.0 | 32.5 | 12.5 | 12.5 | 0.5 | 6.0 | 12.0 | 47.0 | — | — |
| Comparative Example 39 | 40.0 | 32.5 | 12.5 | 12.5 | 35 | 6.0 | 12.0 | 47.0 | — | — |
| Comparative Example 40 | 40.0 | 32.5 | 12.5 | 12.5 | 10 | 6.0 | 12.0 | 47.0 | — | — |
| Comparative Example 41 | 40.0 | 32.5 | 12.5 | 12.5 | 10 | 6.0 | 12.0 | 47.0 | — | — |

| | Glass component composition (wt %) | | | | | Mixing ratio of main component and glass component | |
|---|---|---|---|---|---|---|---|
| | BaO | SrO | SnO2 | ZrO2 | B2O3 | Main component (part by weight) | Glass component (part by weight) |
| Example 43 | 3.0 | 1.0 | 1.0 | — | 30 | 100 | 25 |
| Example 44 | 3.0 | 1.0 | 1.0 | — | 30 | 100 | 25 |
| Example 45 | 3.0 | 1.0 | 1.0 | — | 30 | 100 | 25 |
| Example 46 | 3.0 | 1.0 | 1.0 | — | 30 | 100 | 25 |
| Example 47 | 3.0 | 1.0 | 1.0 | — | 30 | 100 | 25 |
| Example 48 | 3.0 | 1.0 | 1.0 | — | 30 | 100 | 25 |
| Example 49 | 3.0 | 1.0 | 1.0 | — | 30 | 100 | 25 |
| Example 50 | 3.0 | 1.0 | 1.0 | — | 30 | 100 | 25 |
| Example 51 | 3.0 | 1.0 | 1.0 | — | 30 | 100 | 25 |
| Example 52 | 3.0 | 1.0 | 1.0 | — | 30 | 100 | 25 |
| Example 53 | 3.0 | 1.0 | 1.0 | — | 30 | 100 | 25 |
| Example 54 | 3.0 | 1.0 | 1.0 | — | 30 | 100 | 25 |
| Example 55 | 3.0 | 1.0 | 1.0 | — | 30 | 100 | 25 |
| Example 56 | 3.0 | 1.0 | 1.0 | — | 15 | 100 | 25 |
| Example 57 | 3.0 | 1.0 | 1.0 | — | 45 | 100 | 25 |
| Example 58 | — | — | — | — | 30 | 100 | 25 |
| Example 59 | 0.1 | — | — | 0.7 | 30 | 100 | 25 |
| Example 60 | 3.0 | 1.0 | 1.0 | — | 30 | 100 | 10 |
| Example 61 | 3.0 | 1.0 | 1.0 | — | 30 | 100 | 50 |
| Example 62 | 3.0 | 1.0 | 1.0 | — | 30 | 100 | 130 |
| Comparative Example 30 | 3.0 | 1.0 | 1.0 | — | 30 | 100 | 130 |
| Comparative Example 31 | 3.0 | 1.0 | 1.0 | — | 30 | 100 | 25 |
| Comparative Example 32 | 3.0 | 1.0 | 1.0 | — | 30 | 100 | 25 |
| Comparative Example 33 | 3.0 | 1.0 | 1.0 | — | 30 | 100 | 130 |
| Comparative Example 34 | 3.0 | 1.0 | 1.0 | — | 30 | 100 | 130 |
| Comparative Example 35 | 3.0 | 1.0 | 1.0 | — | 30 | 100 | 25 |
| Comparative Example 36 | 3.0 | 1.0 | 1.0 | — | 30 | 100 | 25 |
| Comparative Example 37 | 3.0 | 1.0 | 1.0 | — | 30 | 100 | 25 |
| Comparative Example 38 | 3.0 | 1.0 | 1.0 | — | 30 | 100 | 130 |
| Comparative Example 39 | 3.0 | 1.0 | 1.0 | — | 30 | 100 | 10 |

TABLE 5-continued

| | | | | | | | |
|---|---|---|---|---|---|---|---|
| Comparative Example 40 | 3.0 | 1.0 | 1.0 | — | 30 | 100 | 2.5 |
| Comparative Example 41 | 3.0 | 1.0 | 1.0 | — | 30 | 100 | 160 |

TABLE 6

| | Sintering temperature (° C.) | Dielectric resonator characteristics | | | Tri-plate resonator Unloaded Q |
|---|---|---|---|---|---|
| | | εr (—) | QxfO (GHz) | τf (ppm/° C.) | |
| Example 43 | 975 | 9.8 | 25420 | 4.7 | 250 |
| Example 44 | 925 | 9.5 | 24070 | 1.7 | 245 |
| Example 45 | 900 | 9.4 | 23130 | −2.1 | 240 |
| Example 46 | 900 | 9.3 | 22270 | −6.3 | 240 |
| Example 47 | 875 | 9.1 | 21260 | −18.0 | 235 |
| Example 48 | 900 | 9.5 | 21860 | 7.8 | 240 |
| Example 49 | 925 | 9.3 | 21640 | 6.4 | 235 |
| Example 50 | 950 | 9.3 | 20590 | 14.1 | 230 |
| Example 51 | 950 | 9.2 | 20050 | 18.0 | 230 |
| Example 52 | 900 | 9.4 | 22620 | 2.5 | 240 |
| Example 53 | 925 | 8.8 | 23600 | −12.0 | 240 |
| Example 54 | 875 | 9.4 | 22440 | 4.0 | 240 |
| Example 55 | 850 | 9.0 | 20520 | −10.0 | 230 |
| Example 56 | 950 | 8.4 | 24110 | −7.3 | 245 |
| Example 57 | 900 | 8.7 | 21380 | −4.9 | 235 |
| Example 58 | 875 | 9.7 | 22000 | 2.8 | 240 |
| Example 59 | 925 | 8.7 | 22730 | 2.4 | 240 |
| Example 60 | 975 | 9.7 | 28340 | 5.5 | 260 |
| Example 61 | 875 | 9.2 | 24320 | 0.9 | 245 |
| Example 62 | 825 | 8.8 | 20810 | −7.8 | 230 |
| Comparative Example 30 | Not sintered at 1000° C. or less | | | | |
| Comparative Example 31 | 825 | 8.8 | 6000 | −36.7 | 165 |
| Comparative Example 32 | 825 | 8.7 | 8360 | −33.0 | 170 |
| Comparative Example 33 | Not sintered at 1000° C. or less | | | | |
| Comparative Example 34 | Not sintered at 1000° C. or less | | | | |
| Comparative Example 35 | 825 | 9.5 | 9960 | 32.0 | 175 |
| Comparative Example 36 | 825 | 7.9 | 13300 | −62.7 | 180 |
| Comparative Example 37 | 900 | 10.5 | 12520 | 80.7 | 180 |
| Comparative Example 38 | Not sintered at 1000° C. or less | | | | |
| Comparative Example 39 | Glass was eluted | | | | |
| Comparative Example 40 | Not sintered at 1000° C. or less | | | | |
| Comparative Example 41 | Glass was eluted | | | | |

TABLE 7

| | Main component (molar fraction) | | | | | subcomponent Li2O (part by weight) | Glass component composition (wt %) | | | | |
|---|---|---|---|---|---|---|---|---|---|---|---|
| | a Mg2SiO4 | b ZnAl2O4 | c SiO2 | d CaTiO3 | e Zn2SiO4 | | SiO2 | Al2O3 | ZnO | PbO | Bi2O3 |
| Example 63 | 0.12 | 0.58 | 0.10 | 0.20 | 0 | 5 | 6.0 | 12.0 | 25.0 | — | — |
| Example 64 | 0.35 | 0.35 | 0.10 | 0.20 | 0 | 5 | 6.0 | 12.0 | 25.0 | — | — |
| Example 65 | 0.70 | 0.10 | 0.05 | 0.15 | 0 | 5 | 6.0 | 12.0 | 25.0 | — | — |
| Example 66 | 0.30 | 0.30 | 0.20 | 0.20 | 0 | 5 | 6.0 | 12.0 | 25.0 | — | — |
| Example 67 | 0.15 | 0.55 | 0.15 | 0.15 | 0 | 5 | 6.0 | 12.0 | 25.0 | — | — |
| Example 68 | 0.40 | 0.25 | 0.15 | 0.20 | 0 | 10 | 6.0 | 12.0 | 25.0 | — | — |
| Example 69 | 0.40 | 0.25 | 0.15 | 0.20 | 0 | 10 | 21.0 | 12.0 | 47.0 | — | — |
| Example 70 | 0.40 | 0.25 | 0.15 | 0.20 | 0 | 10 | 6.0 | 12.0 | 32.0 | — | — |
| Example 71 | 0.40 | 0.25 | 0.15 | 0.20 | 0 | 5 | 27.0 | — | 12.0 | 30.0 | 1.0 |

TABLE 7-continued

| | | | | | | | | | | |
|---|---|---|---|---|---|---|---|---|---|---|
| Example 72 | 0.40 | 0.25 | 0.15 | 0.20 | 0 | 5 | 67.0 | 2.2 | — | — | — |
| Example 73 | 0.43 | 0.25 | 0.17 | 0.15 | 0 | 10 | 6.0 | 12.0 | 25.0 | — | — |
| Example 74 | 0.43 | 0.25 | 0.17 | 0.15 | 0 | 10 | 6.0 | 12.0 | 25.0 | — | — |
| Example 75 | 0.43 | 0.25 | 0.17 | 0.15 | 0 | 10 | 6.0 | 12.0 | 25.0 | — | — |
| Example 76 | 0.45 | 0.20 | 0.12 | 0.20 | 0.03 | 5 | 6.0 | 12.0 | 25.0 | — | — |
| Example 77 | 0.28 | 0.28 | 0.19 | 0.20 | 0.05 | 5 | 6.0 | 12.0 | 25.0 | — | — |
| Example 78 | 0.15 | 0.50 | 0.18 | 0.15 | 0.02 | 10 | 6.0 | 12.0 | 25.0 | — | — |
| Example 79 | 0.30 | 0.30 | 0.15 | 0.20 | 0.05 | 5 | 21.0 | 12.0 | 47.0 | — | — |
| Example 80 | 0.30 | 0.30 | 0.15 | 0.20 | 0.05 | 5 | 6.0 | 12.0 | 32.0 | — | — |
| Example 81 | 0.30 | 0.30 | 0.15 | 0.20 | 0.05 | 5 | 27.0 | — | 12.0 | 30.0 | 1.0 |
| Example 82 | 0.30 | 0.30 | 0.15 | 0.20 | 0.05 | 10 | 67.0 | 2.2 | — | — | — |
| Example 83 | 0.28 | 0.28 | 0.19 | 0.20 | 0.05 | 10 | 6.0 | 12.0 | 25.0 | — | — |
| Example 84 | 0.15 | 0.50 | 0.17 | 0.15 | 0.03 | 5 | 6.0 | 12.0 | 25.0 | — | — |
| Comparative Example 42 | 0.75 | 0.07 | 0.05 | 0.13 | 0.00 | 10 | 6.0 | 12.0 | 25.0 | — | — |
| Comparative Example 43 | 0.02 | 0.60 | 0.15 | 0.20 | 0.00 | 10 | 6.0 | 12.0 | 25.0 | — | — |
| Comparative Example 44 | 0.10 | 0.65 | 0.10 | 0.15 | 0.00 | 10 | 6.0 | 12.0 | 25.0 | — | — |
| Comparative Example 45 | 0.60 | 0.05 | 0.15 | 0.20 | 0.00 | 5 | 6.0 | 12.0 | 25.0 | — | — |
| Comparative Example 46 | 0.40 | 0.40 | 0.01 | 0.19 | 0.00 | 5 | 6.0 | 12.0 | 25.0 | — | — |
| Comparative Example 47 | 0.26 | 0.26 | 0.28 | 0.20 | 0.00 | 5 | 6.0 | 12.0 | 25.0 | — | — |
| Comparative Example 48 | 0.30 | 0.40 | 0.20 | 0.10 | 0.00 | 5 | 6.0 | 12.0 | 25.0 | — | — |
| Comparative Example 49 | 0.30 | 0.30 | 0.15 | 0.25 | 0.00 | 5 | 6.0 | 12.0 | 25.0 | — | — |
| Comparative Example 50 | 0.30 | 0.30 | 0.10 | 0.20 | 0.10 | 5 | 6.0 | 12.0 | 25.0 | — | — |
| Comparative Example 51 | 0.35 | 0.35 | 0.10 | 0.15 | 0.05 | 0.5 | 6.0 | 12.0 | 25.0 | — | — |
| Comparative Example 52 | 0.35 | 0.30 | 0.17 | 0.15 | 0.03 | 20 | 6.0 | 12.0 | 25.0 | — | — |
| Comparative Example 53 | 0.35 | 0.30 | 0.17 | 0.15 | 0.03 | 10 | 6.0 | 12.0 | 25.0 | — | — |
| Comparative Example 54 | 0.30 | 0.30 | 0.15 | 0.20 | 0.05 | 5 | 6.0 | 12.0 | 25.0 | — | — |

| | Glass component composition (wt %) | | | | | Mixing ratio of main component and glass component | |
|---|---|---|---|---|---|---|---|
| | BaO | SrO | SnO2 | ZrO2 | B2O3 | Main component (part by weight) | Glass component (part by weight) |
| Example 63 | 25.0 | 1.0 | 1.0 | — | 30.0 | 100 | 25 |
| Example 64 | 25.0 | 1.0 | 1.0 | — | 30.0 | 100 | 25 |
| Example 65 | 25.0 | 1.0 | 1.0 | — | 30.0 | 100 | 25 |
| Example 66 | 25.0 | 1.0 | 1.0 | — | 30.0 | 100 | 25 |
| Example 67 | 25.0 | 1.0 | 1.0 | — | 30.0 | 100 | 25 |
| Example 68 | 25.0 | 1.0 | 1.0 | — | 30.0 | 100 | 25 |
| Example 69 | 3.0 | 1.0 | 1.0 | — | 15.0 | 100 | 25 |
| Example 70 | 3.0 | 1.0 | 1.0 | — | 45.0 | 100 | 25 |
| Example 71 | — | — | — | — | 30.0 | 100 | 25 |
| Example 72 | 0.1 | — | — | 0.7 | 30.0 | 100 | 25 |
| Example 73 | 25.0 | 1.0 | 1.0 | — | 30.0 | 100 | 10 |
| Example 74 | 25.0 | 1.0 | 1.0 | — | 30.0 | 100 | 70 |
| Example 75 | 25.0 | 1.0 | 1.0 | — | 30.0 | 100 | 130 |
| Example 76 | 25.0 | 1.0 | 1.0 | — | 30.0 | 100 | 25 |
| Example 77 | 25.0 | 1.0 | 1.0 | — | 30.0 | 100 | 25 |
| Example 78 | 25.0 | 1.0 | 1.0 | — | 30.0 | 100 | 25 |
| Example 79 | 3.0 | 1.0 | 1.0 | — | 15.0 | 100 | 25 |
| Example 80 | 3.0 | 1.0 | 1.0 | — | 45.0 | 100 | 25 |
| Example 81 | — | — | — | — | 30.0 | 100 | 50 |
| Example 82 | 0.1 | — | — | 0.7 | 30.0 | 100 | 25 |
| Example 83 | 25.0 | 1.0 | 1.0 | — | 30.0 | 100 | 25 |
| Example 84 | 25.0 | 1.0 | 1.0 | — | 30.0 | 100 | 130 |
| Comparative Example 42 | 25.0 | 1.0 | 1.0 | — | 30.0 | 100 | 25 |
| Comparative Example 43 | 25.0 | 1.0 | 1.0 | — | 30.0 | 100 | 25 |
| Comparative Example 44 | 25.0 | 1.0 | 1.0 | — | 30.0 | 100 | 25 |

TABLE 7-continued

| | | | | | | | |
|---|---|---|---|---|---|---|---|
| Comparative Example 45 | 25.0 | 1.0 | 1.0 | — | 30.0 | 100 | 25 |
| Comparative Example 46 | 25.0 | 1.0 | 1.0 | — | 30.0 | 100 | 25 |
| Comparative Example 47 | 25.0 | 1.0 | 1.0 | — | 30.0 | 100 | 25 |
| Comparative Example 48 | 25.0 | 1.0 | 1.0 | — | 30.0 | 100 | 25 |
| Comparative Example 49 | 25.0 | 1.0 | 1.0 | — | 30.0 | 100 | 25 |
| Comparative Example 50 | 25.0 | 1.0 | 1.0 | — | 30.0 | 100 | 25 |
| Comparative Example 51 | 25.0 | 1.0 | 1.0 | — | 30.0 | 100 | 25 |
| Comparative Example 52 | 25.0 | 1.0 | 1.0 | — | 30.0 | 100 | 25 |
| Comparative Example 53 | 25.0 | 1.0 | 1.0 | — | 30.0 | 100 | 2.5 |
| Comparative Example 54 | 25.0 | 1.0 | 1.0 | — | 30.0 | 100 | 160 |

TABLE 8

| | Sintering temperature (° C.) | Dielectric resonator characteristics | | | Tri-plate resonator Unloaded Q |
|---|---|---|---|---|---|
| | | $\epsilon_r$ (—) | QxfO (GHz) | $\tau_f$ (ppm/° C.) | |
| Example 63 | 925 | 7.8 | 28100 | −16.0 | 275 |
| Example 64 | 900 | 9.5 | 25800 | −14.5 | 265 |
| Example 65 | 875 | 9.8 | 20300 | −17.3 | 230 |
| Example 66 | 900 | 8.3 | 24500 | −14.7 | 245 |
| Example 67 | 925 | 9.9 | 28300 | −18.4 | 275 |
| Example 68 | 875 | 9.4 | 23700 | −14.8 | 240 |
| Example 69 | 925 | 9.0 | 25300 | −12.3 | 250 |
| Example 70 | 875 | 9.2 | 22000 | −8.1 | 240 |
| Example 71 | 850 | 9.7 | 20300 | −11.2 | 230 |
| Example 72 | 925 | 8.7 | 20700 | −12.7 | 235 |
| Example 73 | 925 | 9.7 | 25400 | −8.8 | 250 |
| Example 74 | 875 | 9.2 | 22100 | −16.2 | 240 |
| Example 75 | 850 | 8.4 | 21600 | −18.6 | 240 |
| Example 76 | 825 | 9.7 | 20300 | −16.8 | 230 |
| Example 77 | 825 | 9.4 | 21300 | −18.5 | 240 |
| Example 78 | 875 | 8.8 | 23500 | −17.5 | 245 |
| Example 79 | 875 | 9.3 | 26700 | −14.1 | 270 |
| Example 80 | 850 | 9.5 | 23200 | −12.9 | 240 |
| Example 81 | 850 | 9.4 | 21000 | −14.5 | 235 |
| Example 82 | 900 | 9.8 | 24400 | −10.8 | 245 |
| Example 83 | 875 | 9.4 | 23600 | −14.2 | 245 |
| Example 84 | 800 | 8.3 | 20400 | −17.9 | 240 |
| Comparative Example 42 | 850 | 10.8 | 8320 | −18.5 | 175 |
| Comparative Example 43 | Not sintered at 1000° C. or less | | | | |
| Comparative Example 44 | Not sintered at 1000° C. or less | | | | |
| Comparative Example 45 | 875 | 10.5 | 7200 | −15.0 | 170 |
| Comparative Example 46 | Not sintered at 1000° C. or less | | | | |
| Comparative Example 47 | 900 | 7.6 | 3500 | −17.8 | 150 |
| Comparative Example 48 | 875 | 8.2 | 8530 | −39.7 | 175 |
| Comparative Example 49 | 900 | 13.2 | 5200 | 53.0 | 160 |
| Comparative Example 50 | 825 | 10.8 | 6700 | −17.0 | 165 |
| Comparative Example 51 | Not sintered at 1000° C. or less | | | | |
| Comparative Example 52 | Glass was eluted | | | | |
| Comparative Example 53 | Not sintered at 1000° C. or less | | | | |
| Comparative Example 54 | Glass was eluted | | | | |

INDUSTRIAL APPLICABILITY

According to the present invention, it is possible to provide a dielectric ceramic composition that can be sintered at a sintering temperature of 1000° C. or less and is sintered to form dielectric ceramics having a dielectric constant $\epsilon_r$ of not more than 10, a large Q value in high-frequency region, and an absolute value in temperature coefficient $\tau_f$ of resonance frequency of not more than 20 ppm/° C. Since the dielectric ceramic composition can be sintered at a sintering temperature of 1000° C. or less, it is possible to reduce an electric power required for the sintering, to perform simultaneous sintering with a low resistant conductor such as Cu or Ag at relatively low cost, and to provide a laminated ceramic part having an internal electrode comprising Ag or Cu.

What is claimed is:

1. A dielectric ceramic composition containing a Li compound as a subcomponent in an amount of 1 to 15 parts by weight in terms of $Li_2O$ and a glass component in an amount of 5 to 150 parts by weight, based on 100 parts by weight of a main component represented by general formula (4): $aMg_2SiO_4$-$bZnAl_2O_4$-$cSiO_2$-$dCaTiO_3$-$eZn_2SiO_4$, in which the molar fractions of respective components a, b, c, d, and e satisfy $0.10 \leq a \leq 0.72$, $0.08 \leq b \leq 0.62$, $0.02c \leq 0.22$, $0.12 \leq d \leq 0.22$, $0 \leq e \leq 0.08$ (a+b+c+d+e=1).

2. The dielectric ceramic composition as claimed in claim 1, wherein the glass component includes one or more glasses selected from a PbO-base glass, a ZnO-base glass, a $SiO_2$-base glass, a $B_2O_3$-base glass, and a glass comprising two or more oxides selected from the group consisting of $SiO_2$, $Al_{23}$, ZnO, PbO, $Bi_2O_3$, BaO, SrO, $SnO_2$, $ZrO_2$, and $B_2O_3$ 3. The dielectric ceramic composition as claimed in claim 2, wherein the glass component is composed of $SiO_2$ in an amount of 2 to 70 wt %, $Al_2O_3$ in an amount of 0 to 15 wt %, ZnO in an amount of 10 to 55 wt %, PbO in an amount of 0 to 35 wt %, $Bi_2O_3$ in an amount of 0 to 2 wt %, BaO in an amount of 0 to 30 wt %, SrO in an amount of 0 to 2 wt %, $SnO_2$ in an amount of 0 to 2 wt %, $ZrO_2$ in an amount of 0 to 1 wt %, and $B_2O_3$ in an amount of 10 to 50wt %.

4. Dielectric ceramics containing crystalline phases of $Mg_2SiO_4$, $ZnAl_2O_4$, $SiO_2$, and $CaTiO_3$ and a glass phase, which is obtained by sintering the dielectric ceramic composition as claimed in claim 1.

5. Dielectric ceramics containing crystalline phases of $Mg_2SiO_4$, $ZnAl_2O_4$, $SiO_2$, $CaTiO_3$, and $Zn_2SiO_4$ and a glass phase, which is obtained by sintering the dielectric ceramic composition as claimed in claim 1.

6. A material composition for dielectric ceramics represented by general formula (4): $aMg_2SiO_4$-$bZnAl_2O_4$-$cSiO_2$-$dCaTiO_3$-$eZn_2SiO_4$, in which the molar fractions of respective components a, b, c, d, and e satisfy $0.10 \leq a \leq 0.72$, $0.08 \leq b \leq 0.62$, $0.02 \leq c \leq 0.22$, $012 \leq d \leq 0.22$, $0 \leq e \leq 0.08$ (a+b+c+d+e=1).

7. A laminated ceramic part having a plurality of dielectric layers, an internal electrode formed between the dielectric layers and an external electrode electrically connected to the internal electrode, wherein the dielectric layers are constituted of dielectric ceramics obtained by sintering the dielectric ceramic composition as claimed in claim 1, and the internal electrode is made of elemental Cu or elemental Ag, or an alloy material mainly comprising Cu or Ag.

* * * * *